US012754246B2

(12) United States Patent
Olson et al.

(10) Patent No.: US 12,754,246 B2
(45) Date of Patent: Oct. 6, 2026

(54) DETERMINING LONGEVITY OF BATTERIES USING DEPTH OF DISCHARGE

(71) Applicant: Medtronic, Inc., Minneapolis, MN (US)

(72) Inventors: Larold Olson, Chisago City, MN (US); Katherine Bach, Arden Hills, MN (US)

(73) Assignee: Medtronic, Inc., Minneapolis, MN (US)

( * ) Notice: Subject to any disclaimer, the term of this patent is extended or adjusted under 35 U.S.C. 154(b) by 918 days.

(21) Appl. No.: 17/805,821

(22) Filed: Jun. 7, 2022

(65) Prior Publication Data

US 2023/0011629 A1 Jan. 12, 2023

Related U.S. Application Data

(60) Provisional application No. 63/219,304, filed on Jul. 7, 2021.

(51) Int. Cl.

| | |
|---|---|
| ***G01R 31/3842*** | (2019.01) |
| ***G01R 31/36*** | (2020.01) |
| ***G01R 31/392*** | (2019.01) |
| ***H02J 7/82*** | (2026.01) |

(52) U.S. Cl.

CPC ..... *G01R 31/3842* (2019.01); *G01R 31/3648* (2013.01); *G01R 31/392* (2019.01); *H02J 7/82* (2026.01)

(58) Field of Classification Search

None

See application file for complete search history.

(56) References Cited

U.S. PATENT DOCUMENTS 6,820,019 B1 * 11/2004 Kelly .................. A61N 1/3708 320/132
8,090,566 B2 1/2012 Brown
8,983,620 B2 3/2015 Cinbis
2003/0204219 A1 * 10/2003 Gielen .................. A61N 1/378 607/45
2006/0170397 A1 8/2006 Srinivasan et al.
2007/0179548 A1 * 8/2007 Armstrong ............. A61N 1/378 607/29
2008/0177345 A1 * 7/2008 Schmidt ............... A61N 1/3708 607/30
2009/0312809 A1 12/2009 Gandhi et al.

(Continued)

*Primary Examiner* — Julian D Huffman
*Assistant Examiner* — John P Ondrasik
(74) *Attorney, Agent, or Firm* — Shumaker & Sieffert, P.A.

(57) ABSTRACT

Processing circuitry associated with an implantable medical device (IMD) may store a value of a shared voltage as a battery voltage threshold. A shared voltage is a voltage magnitude at which the voltage curves for the population of batteries converge at a particular percent depth of discharge (% DoD). The shared voltage is a consistent voltage magnitude across the population of batteries. Based on the indication that the battery has reached the shared voltage, the processing circuitry may determine any or all of: the battery % DoD level, the amount, e.g., the percent of electrical energy remaining in the battery and the amount of time remaining before the battery reaches its end of service life. In some examples, the processing circuitry may output an elective replacement indicator based on the calculated amount of time remaining before the battery reaches its end of service life.

23 Claims, 6 Drawing Sheets

(56) References Cited

U.S. PATENT DOCUMENTS

| | | | | |
|---|---|---|---|---|
| 2011/0106213 | A1* | 5/2011 | Davis | G16Z 99/00 607/59 |
| 2012/0157755 | A1* | 6/2012 | D'Ambrosio | A61M 60/178 600/16 |
| 2017/0239483 | A1 | 8/2017 | Mathur et al. | |
| 2019/0209847 | A1* | 7/2019 | Younker | A61N 1/378 |
| 2020/0309859 | A1 | 10/2020 | DeShazo | |
| 2020/0368534 | A1 | 11/2020 | Nassif | |
| 2020/0403429 | A1* | 12/2020 | Fishler | G01R 31/36 |

* cited by examiner

DETERMINING LONGEVITY OF BATTERIES USING DEPTH OF DISCHARGE

This application claims the benefit of U.S. Provisional Patent Application 63/219,304, which was filed on Jul. 7, 2021, and is entitled, "DETERMINING LONGEVITY OF BATTERIES USING DEPTH OF DISCHARGE," the entire content of which is incorporated herein by reference.

TECHNICAL FIELD

The disclosure relates to portable device battery management.

BACKGROUND

Batteries, as with any manufactured product, have battery-to-battery variability in the actual capacity delivered during the life of the battery, e.g., in Amp-hours. For medical devices, an elective replacement indicator (ERI) notifies the patient that the battery may need to be replaced. The ERI should notify the patient with enough battery capacity remaining, so the patient and/or healthcare system has time to schedule a replacement. For an implantable medical device (IMD), the patient may have to undergo surgery to remove and replace the entire device when the battery of the IMD nears its end of service (EOS).

SUMMARY

In general, the disclosure describes techniques to determine an amount of energy remaining in a battery that is configured to provide electrical power (e.g., such as to an implantable medical device (IMD)). A population of batteries may refer to a group of batteries having similar characteristics (e.g., amounts of amp-hours at full charge, same chemistry, same voltage etc.). Although batteries in a population may have some similar characteristics, each battery in a population of batteries may have a different voltage discharge curve (battery voltage vs. battery capacity in amp-hours) and different total capacity caused by variation in manufacturing, e.g., small differences in materials, assembly and so on.

A shared voltage, as defined in this disclosure, is a voltage magnitude at which the voltage curves for the population of batteries converge at a particular depth of discharge percentage (% DoD), e.g., the amount of electrical energy discharged as a fraction of the full discharge battery capacity. The shared voltage is a consistent voltage magnitude across the population of batteries. That is, although each battery may have a different voltage discharge curve and different total battery capacity, the discharge curve of each battery converges at a shared voltage. At the shared voltage, the batteries in the population of batteries may have the same percent depth of discharge, e.g., the same percent of battery capacity remaining. In this disclosure, the "same" percent depth of discharge means percent depth of discharge is equal for batteries in the population, within manufacturing and measurement tolerances.

Processing circuitry associated with the IMD may store the value of the shared voltage at a memory location operatively coupled to the processing circuitry as, for example, a battery voltage threshold, or a battery threshold range. The processing circuitry may receive an indication that the battery voltage has satisfied the battery voltage threshold (e.g., less than or equal to the battery voltage threshold). Based on the indication that the battery satisfied the battery voltage threshold, the processing circuitry may determine that the battery voltage has reached the shared voltage. Based on the battery voltage reaching the shared voltage, the processing circuitry may determine any or all of: the battery % DoD level, the amount of electrical energy delivered before reaching the % DoD level, the amount of electrical energy remaining in the battery, e.g., the battery capacity remaining, and the amount of time remaining before the battery reaches its end of service life. Because the shared voltage is a consistent voltage magnitude across the population of batteries, the processing circuitry may accurately determine the battery % DoD level, without regard for where a particular battery fits into the battery population. For instance, although the discharge curves, as well as total capacity, between two batteries in a population may be different, because the shared voltage is consistent for both batteries, the voltage satisfying the battery threshold may be a standardized way to determine when the battery is getting close to an end of service life.

In some examples, the processing circuitry may output an elective replacement indicator based on the calculated amount of time remaining before the battery reaches its end of service life. The processing circuitry may output the elective replacement indicator to allow the patient and caregiver enough time to schedule and prepare for a replacement device.

In one example, this disclosure describes an implantable medical device (IMD) that includes processing circuitry operatively coupled to a memory; a non-rechargeable battery that is one of a population of non-rechargeable batteries; and a sensor, operatively coupled to the processing circuitry, the sensor configured to measure a battery voltage of the non-rechargeable battery, wherein the memory is configured to store a battery voltage threshold based on a shared voltage magnitude, and wherein each of the non-rechargeable batteries in the population having a characteristic to converge at the shared voltage magnitude prior to end of service life and each having a same percent depth of discharge (% DoD) at the shared voltage magnitude; and wherein the processing circuitry is configured to: calculate an amount of time remaining before the end of service life of the non-rechargeable battery, wherein the calculation is based on receiving an indication from the sensor that the measured battery voltage satisfies the battery voltage threshold, and a usage rate of electrical energy output by the battery; and output an elective replacement indicator (ERI) based on the calculation.

In another example, this disclosure describes a system comprising at least one electrode configured to deliver the electrical stimulation to a patient; and a device includes a non-rechargeable battery that is one of a population of non-rechargeable batteries; a sensor, operatively coupled to the processing circuitry, the sensor configured to measure a battery voltage of the non-rechargeable battery; a memory configured to store a battery voltage threshold based on a shared voltage magnitude, and wherein each of the non-rechargeable batteries in the population having a characteristic to converge at the shared voltage magnitude prior to end of service life and each having a same estimated percent depth of discharge (% DoD) at the shared voltage magnitude; processing circuitry coupled to the memory, the processing circuitry configured to: deliver one or more electrical stimulation signal to the patient; calculate an amount of time remaining before the end of service life of the non-rechargeable battery, wherein the calculation is based on receiving an indication from the sensor that the measured battery voltage satisfies the battery voltage threshold, and a usage rate; and output an elective replacement indicator (ERI) based on the calculation.

In another example, this disclosure describes a method for operating a battery powered medical device comprising: receiving, from a sensor operatively coupled to a non-rechargeable battery, a battery voltage of the non-rechargeable battery, wherein the non-rechargeable battery is one of a population of non-rechargeable batteries; comparing, by processing circuitry, the received battery voltage to a battery voltage threshold stored at a memory operatively coupled to the processing circuitry, wherein the battery voltage threshold is based on a shared voltage magnitude, and wherein each of the non-rechargeable batteries in the population having a characteristic for the received battery voltage to converge at the shared voltage magnitude prior to end of service life and each having a same estimated percent depth of discharge (% DoD) at the shared voltage magnitude; in response to determining that the received battery voltage satisfies the battery voltage threshold calculating, by the processing circuitry, an amount of time remaining before the end of service life of the non-rechargeable battery, wherein the calculation is based on the estimated percent depth of discharge at the shared voltage magnitude and a usage rate of electrical energy output by the battery.

In another example, this disclosure describes a non-transitory computer-readable storage medium comprising instructions that, when executed, cause one or more processors of a computing device to: includes calculate an amount of time remaining before the end of service life of a non-rechargeable battery that is one of a population of non-rechargeable batteries, wherein the calculation is based on: receiving an indication from a sensor that a measured battery voltage of the non-rechargeable battery satisfies a battery voltage threshold, and a usage rate of electrical energy output by the battery; wherein the sensor is operatively coupled to the processing circuitry, and the sensor is configured to measure the battery voltage of the non-rechargeable battery, wherein the computer-readable storage medium comprises a memory configured to store the battery voltage threshold, which is based on a shared voltage magnitude, and wherein each of the non-rechargeable batteries in the population having a characteristic to converge at the shared voltage magnitude prior to end of service life and each having a same estimated percent depth of discharge (% DoD) at the shared voltage magnitude.

The details of one or more examples of the disclosure are set forth in the accompanying drawings and the description below. Other features, objects, and advantages of the disclosure will be apparent from the description and drawings, and from the claims.

DETAILED DESCRIPTION

This disclosure describes techniques for determining the amount of time left before a battery powered device (e.g., medical device) needs to have its battery replaced as the battery discharges or when the device needs to be replaced in examples where the battery is not removable from the device. Determining the amount of time remaining is based on a shared voltage, which is a voltage magnitude at which the voltage curves for the population of batteries converge at a particular percent depth of discharge (% DoD). The shared voltage is a consistent voltage magnitude across the population of batteries. Batteries in the population may have a consistent percent of total capacity remaining in the battery when the battery voltage reaches the shared voltage.

Some portable battery powered medical devices may provide electrical stimulation therapy, e.g., sacral nerve stimulation, tibial nerve stimulation, and/or other types of invasive or noninvasive neuromodulation, may provide bladder dysfunction therapy, pain relief and/or other therapeutic benefits. Some medical devices may be implantable medical devices. Estimating the end of battery useful life may be desirable for such portable battery powered devices. In the example of an implantable medical device, replacing the battery may require surgery. If the available battery energy gets too low, it may result in loss of device function, such as sensing, or therapy delivery. However, replacing the device with available energy remaining in the battery may result in unnecessary surgery.

The duration of a battery life may depend on battery-to-battery variability, as well as how the battery is used. For some devices, such as implantable cardiac defibrillators (ICDs), the rate of battery consumption can vary significantly from day to day and hour to hour. For other types of devices, such as neurostimulators, the rate of battery consumption over time may be stable and predictable. The techniques of this disclosure are described with respect to medical devices with a stable and predictable rate of battery consumption, e.g., a stable usage rate, but the techniques should not be considered limited.

Figure 1:
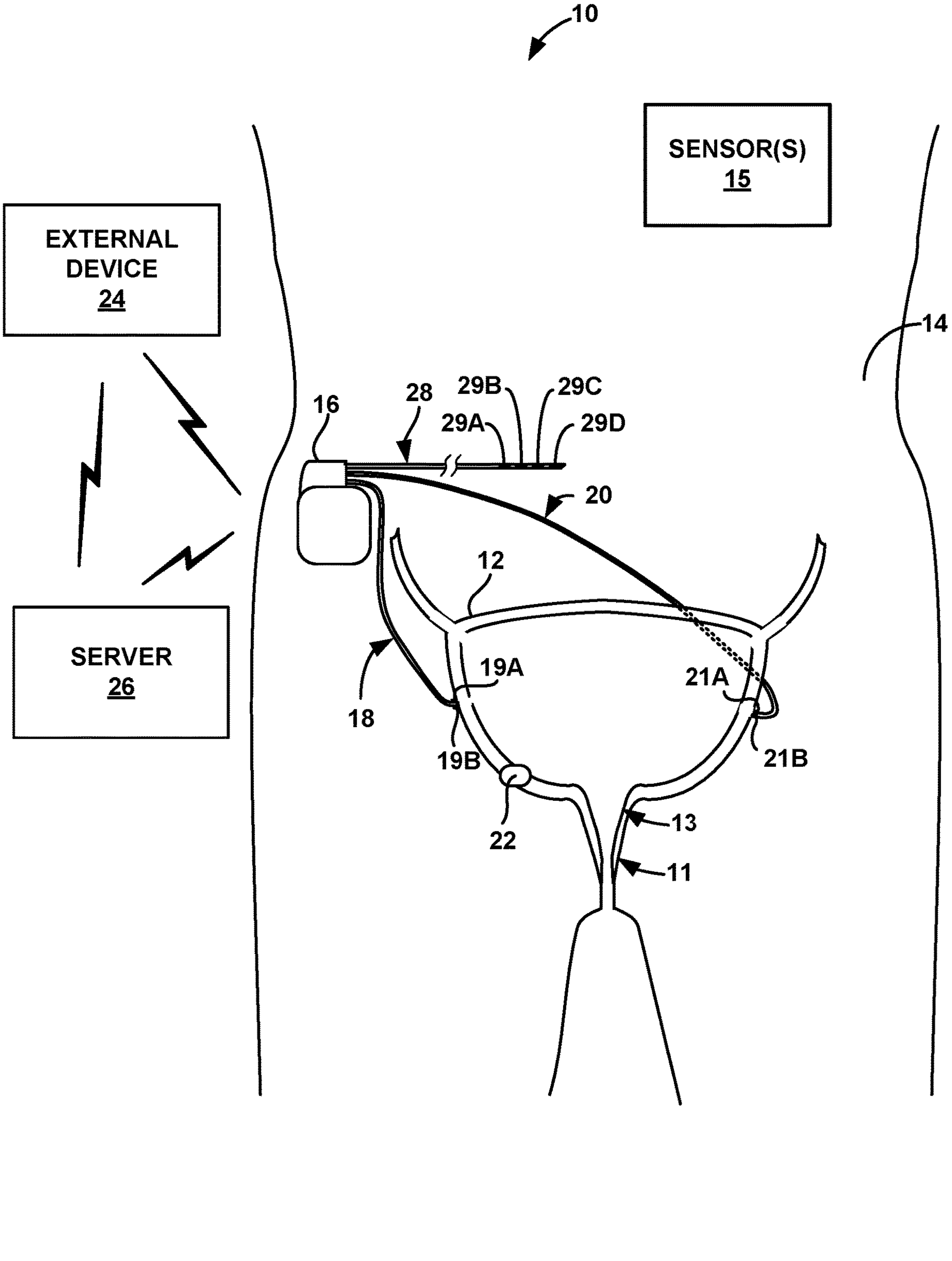
FIG. 1 is a conceptual diagram illustrating an example system that includes an implantable medical device (IMD) configured to deliver electrical stimulation therapy, an external computing device, and one or more sensing devices in accordance with one or more techniques of this disclosure. in accordance with one or more techniques of this disclosure.

FIG. 1 is a conceptual diagram illustrating an example system that includes an implantable medical device (IMD) configured to deliver electrical stimulation therapy, an external computing device, and one or more sensing devices in accordance with one or more techniques of this disclosure in accordance with one or more techniques of this disclosure. The neurostimulation device of system 10 is just one example implementation of the techniques of this disclosure. In other examples, the techniques of this disclosure may be implemented in other battery powered devices, for example, an implantable drug pump.

In some examples, system 10 may determine one or more stimulation setting(s) and manage delivery of neurostimulation to patient 14, e.g., to manage bladder dysfunction, such as retention, overactive bladder, urgency, urinary incontinence, bowel incontinence, as well as deliver pain therapy or other similar electrical stimulation therapy. As shown in the example of FIG. 1, therapy system 10 includes an implantable medical device (IMD) 16 (e.g., an example medical device), which is coupled to leads 18, 20, and 28 and sensor 22. In some examples, system 10 may also include an external computing device 24, which is configured to communicate with IMD 16 via wireless communication as well as with server 26. Server 26 may be one or more servers in a local network or in a cloud computing environment. Server 26 may be configured to communicate with external device 24 and/or IMD 16 via wireless communication through a network access point (not shown in FIG. 1) and may be collocated with external device 24 or may be located elsewhere, such as in a cloud computing data center. IMD 16 may operate as a therapy device that delivers neurostimulation (e.g., electrical stimulation in the example of FIG. 1) to, for example, a target tissue site proximate a spinal nerve, a sacral nerve, a pudendal nerve, dorsal genital nerve, a tibial nerve, a saphenous nerve, an inferior rectal nerve, a perineal nerve, or other pelvic nerves, branches of any of the aforementioned nerves, roots of any of the aforementioned nerves, ganglia of any of the aforementioned nerves, or plexus of any of the aforementioned nerves. IMD 16 provides electrical stimulation to patient 14 by generating and delivering a programmable electrical stimulation signal (e.g., in the form of electrical pulses or an electrical signal) to a target a therapy site near lead 28 and, more particularly, near electrodes 29A-29D (collectively referred to as "electrodes 29") disposed proximate to a distal end of lead 28. IMD 16 may also sense biological, movement and other signals from patient 14.

IMD 16 may be surgically implanted in patient 14 at any suitable location within patient 14, such as near the pelvis. In some examples, IMD 16 may be implanted in a subcutaneous location in the side of the lower abdomen or the side of the lower back or upper buttocks. IMD 16 has a biocompatible housing, which may be formed from titanium, stainless steel, a liquid crystal polymer, or the like. The proximal ends of leads 18, 20, and 28 are both electrically and mechanically coupled to IMD 16 either directly or indirectly, e.g., via respective lead extensions. Electrical conductors disposed within the lead bodies of leads 18, 20, and 28 electrically connect sense electrodes (e.g., electrodes 19A, 19B, 21A, 21B, 29A, 29B, 29C, and 29D) and stimulation electrodes, such as electrodes 29, to sensing circuitry and a stimulation delivery circuitry (e.g., a stimulation generator) within IMD 16. In the example of FIG. 1, leads 18 and 20 carry electrodes 19A, 19B (collective referred to as "electrodes 19") and electrodes 21A, 21B (collectively referred to as "electrodes 21"), respectively. As described in further detail below, electrodes 19 and 21 may be positioned for sensing an impedance of bladder 12, which may increase as the volume of urine within bladder 12 increases. In some examples, system 10 may include electrodes (such as electrodes 19 and 21), a strain gauge, one or more accelerometers, ultrasound sensors, optical sensors, or any other sensor. In some examples, the sensors may be configured to gather information relating to the patient, such as detect contractions of bladder 12, pressure or volume of bladder 12, or any other indication of the fill cycle of bladder 12 and/or possible bladder dysfunctional states. In some examples, system 10 may use sensors other than electrodes 19 and 21 for sensing information relating to the patient, such as bladder volume. System 10 may use the sensor data for determining stimulation program settings for a given patient, as discussed below. IMD 16 may communicate sensed data to server 26. In some examples, IMD 16 may communicate the sensor data through external computing device 24. In other examples, IMD 16 may communicate the sensor data to server 26 without communicating the sensor data through external device 24. External computing device 24 may also be referred to as external device 24, programmer 24. In some examples external device 24 may include circuitry to wirelessly deliver power, e.g., transcutaneous power transfer, to IMD 16.

Although the example of FIG. 1 is directed to management of bladder dysfunction, in other examples, system 10 may be configured to treat other conditions that may benefit from neurostimulation therapy. For example, system 10 may be used to treat tremor, Parkinson's disease, epilepsy, or other neurological disorders, urinary or fecal incontinence, sexual dysfunction, obesity, or gastroparesis, or psychiatric disorders such as depression, mania, obsessive compulsive disorder, or anxiety disorders. Hence, in some examples, system 10 may be configured to deliver sacral neuromodulation (SNM), sacral neurostimulation (SNS), deep brain stimulation (DBS), peripheral nerve stimulation (PNS), or other stimulation, such as peripheral nerve field stimulation (PNFS), cortical stimulation (CS), gastrointestinal stimulation, or any other stimulation therapy capable of treating a condition of patient 14. In some examples, system 10 may be configured where the electrical stimulation includes stimulation parameters to deliver therapy to address a condition of one or more of painful diabetic neuropathy (PDN), peripheral vascular disease (PVD), peripheral artery disease (PAD), complex regional pain syndrome (CRPS), angina pectoris (AP), leg pain, back pain or pelvic pain.

One or more medical leads, e.g., leads 18, 20, and 28, may be connected to IMD 16 and surgically or percutaneously tunneled to place one or more electrodes carried by a distal end of the respective lead at a desired nerve or muscle site, e.g., one of the previously listed target therapy sites such as a tissue site proximate a spinal (e.g., sacral) or pudendal nerve. For example, lead 28 may be positioned such that electrodes 29 deliver electrical stimulation to a spinal, sacral or pudendal nerve to reduce a frequency and/or magnitude of contractions of bladder 12. Additional electrodes of lead 28 and/or electrodes of another lead may provide additional stimulation therapy to other nerves or tissues as well. In FIG. 1, leads 18 and 20 are placed proximate to an exterior surface of the wall of bladder 12 at first and second locations, respectively. In other examples of therapy system 10, IMD 16 may be coupled to more than one lead that includes electrodes for delivery of electrical stimulation to different stimulation sites within patient 14, e.g., to target different nerves.

In the example shown in FIG. 1, leads 18, 20, 28 are cylindrical. Electrodes 19, 21, 29 of leads 18, 20, 28, respectively, may be ring electrodes, segmented electrodes, partial ring electrodes or any suitable electrode configuration. Segmented and partial ring electrodes each extend along an arc less than 360 degrees (e.g., 90-120 degrees) around the outer perimeter of the respective lead 18, 20, 28. In some examples, segmented electrodes 29 of lead 28 may be useful for targeting different fibers of the same or different nerves to generate different physiological effects (e.g., therapeutic effects). In examples, one or more of leads 18, 20, 28 may be, at least in part, paddle-shaped (e.g., a "paddle" lead), and may include an array of electrodes on a common surface, which may or may not be substantially flat.

In some examples, one or more of electrodes 19, 21, 29 may be cuff electrodes that are configured to extend at least partially around a nerve (e.g., extend axially around an outer surface of a nerve). Delivering electrical stimulation via one or more cuff electrodes and/or segmented electrodes may help achieve a more uniform electrical field or activation field distribution relative to the nerve, which may help minimize discomfort to patient 14 that results from the delivery of electrical stimulation. An electrical field may define the volume of tissue that is affected when the electrodes 19, 21, 29 are activated. An activation field represents the neurons that will be activated by the electrical field in the neural tissue proximate to the activated electrodes.

The illustrated numbers and configurations of leads 18, 20, and 28 and electrodes carried by leads 18, 20, and 28 are merely exemplary. Other configurations, e.g., numbers and positions of leads and electrodes are also contemplated. For example, in other implementations, IMD 16 may be coupled to additional leads or lead segments having one or more electrodes positioned at different locations proximate the spinal cord or in the pelvic region of patient 14. The additional leads may be used for delivering different stimulation therapies or other electrical stimulations to respective stimulation sites within patient 14 or for monitoring at least one physiological marker of patient 14.

In accordance with some examples of the disclosure, IMD 16 delivers electrical stimulation to at least one of a spinal nerve (e.g., a sacral nerve), a pudendal nerve, dorsal genital nerve, a tibial nerve, a saphenous nerve, an inferior rectal nerve, or a perineal nerve to provide a therapeutic effect that reduces or eliminates a dysfunctional state such as overactive bladder. The desired therapeutic effect may be pain reduction, an inhibitory physiological response related to voiding of patient 14, such as a reduction in bladder contraction frequency by a desired level or degree (e.g., percentage), a reduction in bladder afferent firing, altering a pelvic floor muscle/nerve response and/or status such as of the external urethral sphincter (EUS), levator ani nerve, external anal sphincter, and the like.

A stimulation program may define various parameters of the stimulation signal and electrode configuration which result in a predetermined stimulation intensity being delivered to the targeted nerve or tissue. In some examples, the stimulation program defines parameters for at least one of a current or voltage amplitude of the stimulation signal, a frequency or pulse rate of the stimulation, the shape of the stimulation signal, a duty cycle of the stimulation, a pulse width of the stimulation, a duty cycle of the stimulation ON/OFF periods, and/or the combination of electrodes 29 and respective polarities of the subset of electrodes 29 used to deliver the stimulation. Together, these stimulation parameter values may be used to define the stimulation intensity (also referred to herein as a stimulation intensity level). In some examples, if stimulation pulses are delivered in bursts, a burst duty cycle also may contribute to stimulation intensity. Also, independent of intensity, a particular pulse width and/or pulse rate may be selected from a range suitable for causing the desired therapeutic effect after stimulation is terminated and, optionally, during stimulation. In addition, as described herein, a period during which stimulation is delivered may include on and off periods (e.g., a duty cycle or bursts of pulses) where even the short inter-pulse durations of time when pulses are not delivered are still considered part of the delivery of stimulation. A period during which system 10 withholds stimulation delivery is a period in which no stimulation program is active for IMD 16 (e.g., IMD 16 is not tracking pulse durations or inter-pulse durations that occur as part of the electrical stimulation delivery scheme).

In addition to the above stimulation parameters, the stimulation may be defined by other characteristics, such as a time for which stimulation is delivered, a time for which stimulation is terminated, and times during which stimulation is withheld. Changing the various parameters of stimulation program may change the usage rate of electrical energy stored in an electrical energy storage device of IMD 16, such as a rechargeable battery, a non-rechargeable battery, a capacitor, or other similar electrical energy storage device. In some examples a non-rechargeable battery may be referred to as a primary cell, or primary cell type battery.

For some examples of implantable medical devices, such as neurostimulators including IMD 16, the rate of battery consumption over time, e.g., the usage rate, may be predictable. Though the usage rate of a neurostimulator may vary somewhat, e.g., the device may consume more power during wireless communication then when not in a wireless communication session, the usage rate, may be stable and predictable, when compared to other devices. In some examples, for battery longevity purposes, the usage rate may be assumed to be constant. In some examples, processing circuitry associated with the medical device, may use some measure of central tendency for usage rate, e.g., and average usage rate, a median usage rate, a mode, and so on as the estimated usage rate.

In other examples, for changes in stimulation therapy parameters, such as changes in the amplitude, pulse width or frequency, on-time vs. off-time or other parameters of the stimulation pulses output by 1 MB 16, which may be changed by reprogramming IMD 16, processing circuitry associated with 1 MB 16 may calculate an updated estimate of the usage rate of the electrical energy stored in the energy storage device. In some examples, processing circuitry associated with IMD 16, e.g., any or all of processing circuitry within IMD 16, in external computing device 24, and/or server 26 may store the date of a change in the programming of the IMD 16 as well as determine and store the used battery capacity at that time. The processing circuitry may determine the used capacity of the battery of IMD 16 since the last programming change by determining the current used battery capacity and subtracting it from the previously stored used battery capacity at the time of the programming change. In this way, the processing circuitry may determine battery capacity used since the programming change. The remaining battery capacity can be divided by this capacity used per time unit amount since IMD 16 was reprogrammed. In some examples, the processing circuitry may determine the usage rate by measuring battery current, such as with a shunt resistor, or some other type of coulomb counter. In other examples, processing circuitry may retrieve a lookup table of possible stim settings with their empirically measured current drains from, for example, empirical testing. Then the processing circuitry may execute firmware that compares the current settings to the lookup table and uses results of the comparison as the usage rate. In this disclosure, a battery of a population of batteries may have an initial or beginning of life battery capacity. The percent depth of discharge (e.g., % DoD) may indicate the percent of total battery capacity used at a point in time.

In other examples, the processing circuitry may be configured to compare a first usage rate from before a programming change to a second usage rate after the programming change. The processing circuitry may be configured to determine whether the first usage rate is different enough, e.g., exceeds a threshold difference, from the second usage rate. In response to the first usage rate and the second usage rate within a threshold difference of each other, the processing circuitry may use a single estimated usage rate in the longevity calculation, even with a change in programming.

In some examples, the processing circuitry may be configured, e.g., may execute programming instructions, that determine the usage rate based on a battery capacity used per unit time. The processing circuitry may calculate the usage rate by dividing the used capacity of the battery by the length of time since beginning of life.

In other examples, 1 MB 16 may include one or more sensors, such as an electrical voltage sensor and an electrical current sensor configured to measure battery electrical current magnitude. The processing circuitry may be configured to determine the usage rate based on the measured battery electrical current magnitude.

In other examples, the processing circuitry may be configured to calculate the amount of time remaining based on an estimation that the first usage rate from beginning of life (BOL) to a percent depth of discharge (% DoD), which the electrical voltage sensor indicates that the battery voltage is the shared voltage, will be substantially the same as a second usage rate from when the battery voltage reaches the shared voltage to the end of service life of the battery. In other words, the processing circuitry may estimate that the electrical current consumption during the first portion of device life, from BOL is approximately the same as the electrical current consumption from the shared voltage point to the end of service life, e.g., a stable and predictable usage rate.

System 10 may also include external device 24, as shown in FIG. 1. External device 24 may be an example of a computing device. In some examples, external device 24 may be a clinician programmer or patient programmer, such as patient programmer 300 described below. In other examples, external device 24 may be implemented as an application running on a tablet computer, mobile phone or other computing device. In some examples, external device 24 may be a device for inputting information relating to a patient. In some examples, external device 24 may be a wearable communication device, with a therapy request input integrated into a key fob or a wristwatch, handheld computing device, smart phone, computer workstation, or networked computing device. External device 24 may include a user interface that is configured to receive input from a user (e.g., patient 14, a patient caretaker or a clinician). In some examples, the user interface includes, for example, a keypad and a display, which may for example, be a liquid crystal display (LCD) or light emitting diode (LED) display. In some examples, the user interface may include a turnable knob or a representation of a turnable knob. The keypad may take the form of an alphanumeric keypad, or a reduced set of keys associated with particular functions. External device 24 may additionally or alternatively include a peripheral pointing device, such as a mouse, via which a user may interact with the user interface. In some examples, a display of external device 24 may include a touch screen display, and a user may interact with external device 24 via the display. It should be noted that the user may also interact with external device 24, server 26 and/or IMD 16 remotely via a networked computing device.

A user, such as a physician, technician, surgeon, electrophysiologist, or other clinician, may also interact with external device 24 or another separate programmer (not shown), such as a clinician programmer, to communicate with IMD 16 and/or server 26. Such a user may interact with external device 24 to retrieve physiological or diagnostic information from IMD 16. The user may also interact with external device 24 to program IMD 16, e.g., select values for the stimulation parameter values with which IMD 16 generates and delivers stimulation and/or the other operational parameters of IMD 16, such as magnitudes of stimulation energy, user requested periods for stimulation or periods to prevent stimulation, or any other such user customization of therapy. In some examples, the stimulation parameter values may be proposed by system 10, for example, by server 26 and a user may be able to accept or reject the stimulation parameter values. In other examples, the stimulation parameter values may be set by system 10, for example, by server 26. In some examples, the user may also provide input to external device 24 indicative of physiological events such as bladder fill level perception and void events.

In some examples, a healthcare provider may set up system 10 to use sensor 15, such as wearable sensors or existing implanted sensors, to collect patient data related to sleep, activity, or disease symptoms. Sensor 15 may include one or more sensors, e.g., sensor(s) 15. For example, sensors 15 may be a heartrate sensor, an accelerometer and/or other sensor to collect patient data, for example, on disease symptoms or lifestyle. Server(s) 26 and/or external device 24 may receive the patient data captured by the sensors, such as by sensor 15. In some examples, the sensors, such as sensor 15, may be configured to communicate with an external device, such as external device 24, via a wireless link. In some examples, external device 24 may collect the patient data generated by the sensors and send the patient data to server 26. In other examples, another device may collect the patient data generated by the sensors and send the patient data to server 26.

In some examples, IMD 16 and/or external device 24 may receive information from sensor 15 directly, e.g., via wireless communication, or indirectly, such as from server 26 via a network connection. Sensor 15 may be positioned to sense one or more physiological responses at a selected location on patient 14. In some examples, sensor 15 may be positioned at, attached to or near tissue for a target anatomical area, e.g., at a limb or appendage, such as at or on a leg, toe, foot, arm, finger, or hand of patient 14, e.g., to sense an EMG, a galvanic skin response adjacent to placement of sensor 15, or other response. In some examples, sensor 15 may be attached to an appendage of the patient 14 to sense a physiological response associated with the appendage, e.g., by a clip-on mechanism, strap, elastic band and/or adhesive. In some examples, sensor 15 (or one of a plurality of sensors 15) may be implantable within patient 14, e.g., within a limb or appendage of the patient, near the spinal cord of the patient, within the brain of the patient, and the like.

In some examples, sensor 15 may be a physiological and/or patient posture or behavior sensor. For example, sensor 15 may be a heart rate monitor configured to detect and/or determine a heart rate and/or a heart rate variability. Sensor 15 may be configured to detect and/or determine a biopotential. Sensor 15 may be a thermometer configured to detect and/or determine a temperature of at least a part of the patient's anatomy. Sensor 15 may be configured to measure a pressure, e.g., a patient blood pressure, or to measure an impedance of at least a portion of the patient's anatomy. Sensor 15 may be a blood flow sensor that measures blood flow and provides information related to blood flow associated with tissue of the patient. For example, sensor 15 may provide blood flow values, or other information indicative of blood flow values or changes in blood flow values. The blood flow value may be an instantaneous blood flow measurement or may be a measurement of blood flow over a period of time such as average blood flow value, maximum blood flow value, minimum blood flow value during the period of time. In some examples, sensor 15 may be a microphone configured to detect/determine sounds of at least a portion of the patient's anatomy. In some examples, sensor 15 may comprise and accelerometer configured to detect and/or determine a position and/or patient movement, a patient movement history over a predetermined amount of time, and the like. In some examples, sensor 15 may be configured to receive patient 14 input such as a pain response, a pain score, an area of pain, an amount of paresthesia, an area of paresthesia, information relating to voiding and/or a voiding rate (e.g., voids per day), and the like. In some examples, sensor 15 may be an environmental sensor, such as a microphone, thermometer, hygrometer, pressure sensor, and the like, configured to detect and/or determine sounds, temperatures, humidity, and pressure, etc., of the environment in which the patient 14 is located.

In some examples, the user may use external device 24 to retrieve information from IMD 16 relating to the contraction frequency of bladder 12 and/or voiding events. As another example, the user may use external device 24 to retrieve information from IMD 16 relating to the performance or integrity of IMD 16 or other components of system 10, such as leads 18, 20, and 28, or a power source of IMD 16. In some examples, this information may be presented to the user as an alert if a system condition that may affect the efficacy of therapy is detected.

The user of external device 24 may also communicate with server 26. For example, the user of external device 24 may provide information relating to the patient to server 26, such as demographic information, medical history, lifestyle information, bladder events, level satisfaction with therapy or sensor data.

Patient 14 may, for example, use a keypad or touch screen of external device 24 to request IMD 16 to deliver or terminate the electrical stimulation, such as when patient 14 senses that a leaking episode may be imminent or when an upcoming void may benefit from terminating therapy that promotes urine retention. In this way, patient 14 may use external device 24 to provide a therapy request to control the delivery of the electrical stimulation "on demand," e.g., when patient 14 deems the second stimulation therapy desirable. This request may be a therapy trigger event used to terminate electrical stimulation. Patient 14 may also use external device 24 to provide other information to IMD 16, such as information indicative of a phase of a physiological cycle, such as the occurrence of a voiding event.

External device 24 may provide a notification to patient 14 when the electrical stimulation is being delivered or notify patient 14 of the prospective termination of the electrical stimulation. In addition, notification of termination may be helpful so that patient 14 knows that a voiding event may be more probable and/or the end of the fill cycle is nearing such that the bladder should be emptied (e.g., the patient should visit a restroom). In such examples, external device 24 may display a visible message, emit an audible alert signal, or provide a somatosensory alert (e.g., by causing a housing of external device 24 to vibrate). In other examples, the notification may indicate when therapy is available (e.g., a countdown in minutes, or indication that therapy is ready) during the physiological cycle. In this manner, external device 24 may wait for input from patient 14 prior to terminating the electrical stimulation that reduces bladder contraction or otherwise promotes urine retention. Patient 14 may enter input that either confirms termination of the electrical stimulation so that the therapy stops for voiding purposes, confirms that the system should maintain therapy delivery until patient 14 may void, and/or confirms that patient 14 is ready for another different stimulation therapy that promotes voiding during the voiding event.

In the event that no input is received within a particular range of time when a voiding event is predicted, external device 24 may wirelessly transmit a signal that indicates the absence of patient input to IMD 16. IMD 16 may then elect to continue stimulation until the patient input is received, or terminate stimulation, based on the programming of IMD 16. In some examples, the termination or continuation of electrical stimulation may be responsive to other physiological markers.

IMD 16 and external device 24 may communicate via wireless communication using any techniques known in the art. Examples of communication techniques may include, for example, low frequency or radiofrequency (RF) telemetry, but other techniques are also contemplated. In some examples, external device 24 may include a programming lead that may be placed proximate to the patient's body near the IMD 16 implant site in order to improve the quality or security of communication between IMD 16 and external device 24.

IMD 16, in response to commands from external device 24, may deliver electrical stimulation therapy according to a one or more stimulation programs to a target tissue site of the patient 14 via any of electrodes 29A-29D, 19A-19B, and 21A-21B. In some examples, IMD 16 automatically modifies therapy stimulation programs as therapy needs of patient 14 evolve over time. For example, the modification of the therapy stimulation programs may cause the adjustment of at least one parameter of the plurality of stimulation pulses based on received information.

In the example four-wire arrangement shown in FIG. 1, electrodes 19A and 21A and electrodes 19B and 21B, may be located substantially opposite each other relative to the center of bladder 12. For example, electrodes 19A and 21A may be placed on opposing sides of bladder 12, either anterior and posterior or left and right. In FIG. 1, electrodes 19 and 21 are shown placed proximate to an exterior surface of the wall of bladder 12. In some examples, electrodes 19 and 21 may be sutured or otherwise affixed to the bladder wall. In other examples, electrodes 19 and 21 may be implanted within the bladder wall. To measure the impedance of bladder 12, IMD 16 may source an electrical signal, such as current, to electrode 19A via lead 18, while electrode 21A via lead 20 sinks the electrical signal. IMD 16 may then determine the voltage between electrode 19B and electrode 21B via leads 18 and 20, respectively. IMD 16 determines the impedance of bladder 12 using a known value of the electrical signal sourced the determined voltage.

In the example of FIG. 1, IMD 16 also may include a sensor 22 for detecting changes in the contraction of bladder 12. Sensor 22 may include, for example, a pressure sensor for detecting changes in bladder pressure, electrodes for sensing pudendal or sacral nerve signals (e.g., afferent and/or efferent), electrodes for sensing urinary sphincter EMG signals (or anal sphincter EMG signals in examples in which system 10 provides therapy to manage fecal urgency or fecal incontinence), or any combination thereof. In examples in which sensor 22 is a pressure sensor, the pressure sensor may be a remote sensor that wirelessly transmits signals to IMD 16 or may be carried on one of leads 18, 20, or 28 or an additional lead coupled to IMD 16. In some examples, IMD 16 may determine whether a contraction frequency of bladder 12 has occurred based on a pressure signal generated by sensor 22. In some examples, IMD 16 may control the timing of the delivery of the electrical stimulation based on input received from sensor 22.

Sensor 22 may comprise a patient motion sensor that generates a signal indicative of patient activity level or posture state. In some examples, IMD 16 may terminate the delivery of the electrical stimulation to patient 14 upon detecting a patient activity level exceeding a particular threshold based on the signal from the motion sensor. In other examples, IMD 16 may use sensor 22 to identify posture states known to require the desired therapeutic effect. For example, patient 14 may be more prone to an involuntary voiding event when patient 14 is in an upright posture state compared to a lying down posture state. In any event, electrodes 19 and 21 and sensor 22 may be configured to detect voiding events and/or the magnitude of a fill level of bladder 12 during the fill cycle. In some examples, IMD 16 may include sensor 22 and/or a motion sensor, e.g., within the housing of IMD 16. In other examples, IMD 16 may not have any sensors.

As discussed above, system 10 may monitor the fill cycle of bladder 12 by detecting subsequent voiding events over time. In some examples, system 10 may detect voiding events by receiving an indication of a user input (e.g., via external device 24) representative of an occurrence of a voiding event. In other words, external device 24 may receive input from the user identifying that a voiding event occurred, the beginning of a voiding event, and/or the end of the voiding event. In other examples, system 10 may automatically detect voiding events without receiving user input via external device 24. System 10 may instead detect voiding events by detecting at least one of a pressure of the bladder, a flow of urine from the bladder, a wetness of an article external of the patient, a volume of the bladder, an EMG signal, a nerve recording, a posture change, a physical location of the patient within a structure such as a house or care facility, or a toilet use event. Some sensors external to patient 14 may communicate with external device 24 and/or IMD 16 to provide this information indicative of likely voiding events. For example, wetness may be detected by a moisture sensor (e.g., electrical impedance or chemical sensor) embedded in an undergarment worn by the patient and transmitted to IMD 16 or external device 24. Similarly, a toilet may include a presence sensor that detects when a patient is using the toilet (e.g., an infrared sensor, thermal sensor, or pressure senor) and transmits a signal indicating the presence of the patient to IMD 16 or external device 24. In this manner, non-invasively obtained data may provide information indicative of voiding events without implanted sensors. The information indicative of voiding events may be provided to server 26 by external device 24 or IMD 16. System 10 of FIG. 1 may implement the techniques of this disclosure.

Figure 2A:
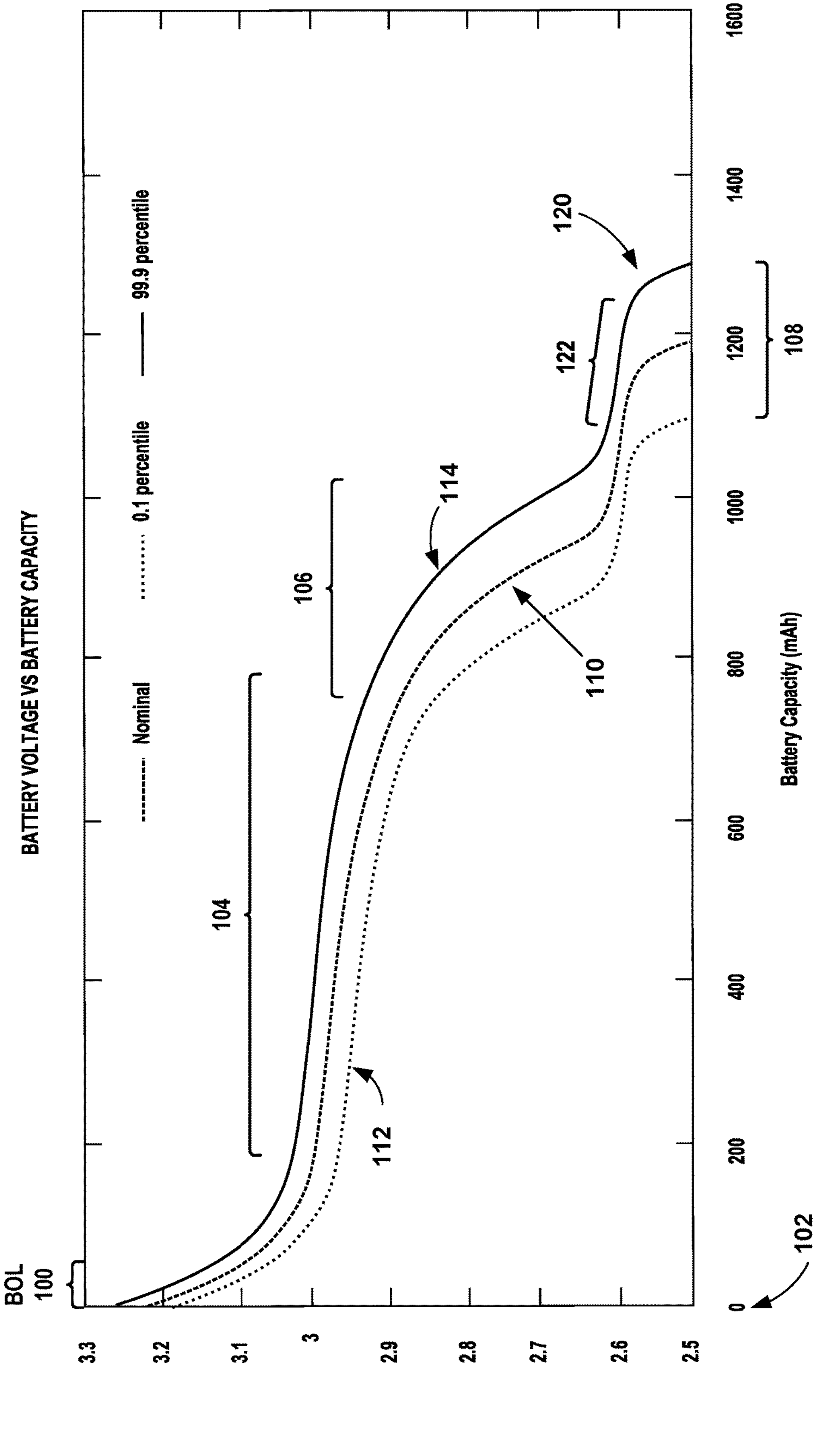
FIG. 2A is a graph illustrating an example battery discharge curve in battery voltage vs. battery capacity in Amp-hours.

FIG. 2A is a graph illustrating an example battery discharge curve in battery voltage vs. battery capacity in milliamp-hours (mAh). As the battery provides electrical energy, using the batteries capacity, the battery voltage may decrease in a characteristic curve. A battery may present a characteristic discharge curve from when the battery begins providing energy to a load until the battery has no electrical energy available. The characteristic curve may differ based on the battery chemistry. For example, a lithium-ion (Li-ion) battery discharge curve may have a different shape when compared to other battery chemistries, such as a rechargeable lithium-ion polymer (Li-Po) battery, non-rechargeable silver vanadium oxide (SVO) or other types of battery chemistry. Also, the usage rate (e.g., constant usage, random usage, high current drain, low current drain, etc.) for the battery may affect the shape of the characteristic discharge curve.

The example of FIG. 2A shows a characteristic discharge curve for a SVO battery that is discharging at an approximately constant usage rate. The discharge curve may also apply, more specifically, to lithium-hybrid cathode, e.g., CFx/CSVO batteries. That is, the usage rate, e.g., battery current, is approximately the same from battery attach 102 to the end of service life 120. In some examples, end of service life 120 may be defined by the load, e.g., circuit, supplied by the battery. For example, some circuits may stop functioning, or behave erratically, when the supply voltage drops below a voltage threshold. The lowest operational battery voltage for which the circuit functions predictably may define the end of service life 120.

Batteries, including primary cell batteries, may have variability in the actual capacity delivered during the life of the battery. The battery performance of a population of batteries may be described by a statistical distribution, e.g., a normal distribution, uniform distribution, or some other distribution. The battery performance may be affected by lot to lot variations in the chemistry, type of foil (e.g., sintered or not), battery thickness of the foil may all impact the discharge curve. Different types of batteries may define different populations of batteries, which may be based on size, shape, number of layers, type of chemistry and so on. The discharge curve may be based on testing samples from the population in run-down tests.

The example of FIG. 2A depicts three battery curves defining an example distribution for a population of non-rechargeable batteries. Each of the non-rechargeable batteries in the population may follow a similar characteristic curve as shown in FIG. 2A. Most batteries in the population may follow a curve that is between the $99.9^{th}$ percentile curve 114 and the 0.1 percentile curve 112, with a nominal battery following curve 110 as it supplies electrical energy to a circuit, e.g., a circuit within IMD 16 described above in relation to FIG. 1.

The techniques of this disclosure may also apply to rechargeable batteries, for a rechargeable battery has the same characteristic of converging at the same % DoD at a known voltage. For a rechargeable battery, the techniques of this disclosure may derive a more accurate estimate of low battery status. In some examples, the processing circuitry may output notification of "20% remaining" or a similar indication, which may alert the patient to consider recharging the battery.

In the example of FIG. 2A, the available capacity range 108 from 0.1 percentile battery to a 99.9 percentile battery is approximately 1100-1300 mAh, with a nominal capacity of 1200 mAh.

Because of the 'flat' areas of the characteristic discharge curve, e.g., 104 and 122, the battery voltage measurement may not be an accurate estimate of the remaining capacity for the battery. The flat areas refer to areas in the discharge curve where there is a reduction in battery capacity but with little change in the voltage. For example, a battery may discharge 400 mA-hr between 200 mA-hr and 600 mA-hr with only a small change in voltage. Unless a battery voltage measurement circuit is very accurate, it may be difficult to determine how much capacity is remaining in a battery by only measuring the battery voltage. Also, the distribution of battery curves may have a different capacity at the same measured voltage.

Similarly, near the end of service life 120, in region 122, only small changes in battery voltage, e.g., a few tenths of a volt, may be the voltage difference between 1100 mA-hr and 1250 mA-hr for the 99.9th percentile curve 114. It may be desirable to use the full battery capacity of the battery and still have an accurate estimate of the capacity remaining in the battery. For medical devices with non-rechargeable batteries, replacing a device too early may result an unnecessary surgery for the patient who may have, for example, weeks or months of service life remaining before end of service life 120. Waiting too long to replace a device may result in a device that does not deliver the desired therapy, perform the desired sensing, or perform other functions when the battery capacity gets used.

In some examples, using a current measurement system in an implantable medical device, such as a coulomb counter, may enable processing circuitry in the device to track the usage rate. The processing circuitry is configured to determine the usage rate based on the measured battery electrical current magnitude. The processing circuitry may be configured, in some examples, to determine the amount of time remaining before the end of service life of the non-rechargeable battery based on: the measured battery electrical current magnitude; and the specified amount of battery capacity remaining.

However, the battery variability, as shown in the example of FIG. 2A, may cause an eight to ten percent uncertainty in the battery life. For example, a coulomb counter, without other cross-checking, may accurately measure an amount of battery capacity consumed. But for example, at 1000 mAhrs, a 0.1% battery (112) may only have 100 mAhrs remaining, while a 99.9% battery (114) may have about 300 mAhr remaining. In addition, in some examples, a coulomb counter may consume some portion of the battery capacity to operate, thereby shortening battery life.

As illustrated in FIG. 2A, near the beginning of life, BOL 100, and in region 106, the characteristic battery discharge curve is 'steep,' e.g., a larger voltage drop for a given expenditure of battery capacity, when compared to the flat regions of 104 and 122. In regions where the battery discharge curve is steep, processing circuitry may be able to track capacity by measuring battery voltage. However, as with the coulomb counter, variability, e.g., caused by manufacturing variability, may complicate battery longevity calculations. Manufacturing variability may arise from lot-to-lot variation in the materials used to make the batteries, e.g., the plates of the electrodes, the roughness of the plates, small differences in battery housing volume, manufacturing machinery differences from machine to machine, and so on.

Beginning of life for a battery may defined in different ways. In some examples, BOL 100 may be determined by the time the battery is first attached to the rest of the device circuitry during manufacturing. In other examples, BOL 100 may be determined based on a predetermined battery voltage for a particular battery chemistry of battery type. For example, the BOL 100 battery voltage for one type of battery may be a different value than a second battery type. In other examples, BOL 100 may be defined based on a predetermined manufacturing step, such as when sealing the housing for the medical device, after a specified electrical manufacturing test, such as an automated production test, or some other specified manufacturing step.

Figure 2B:
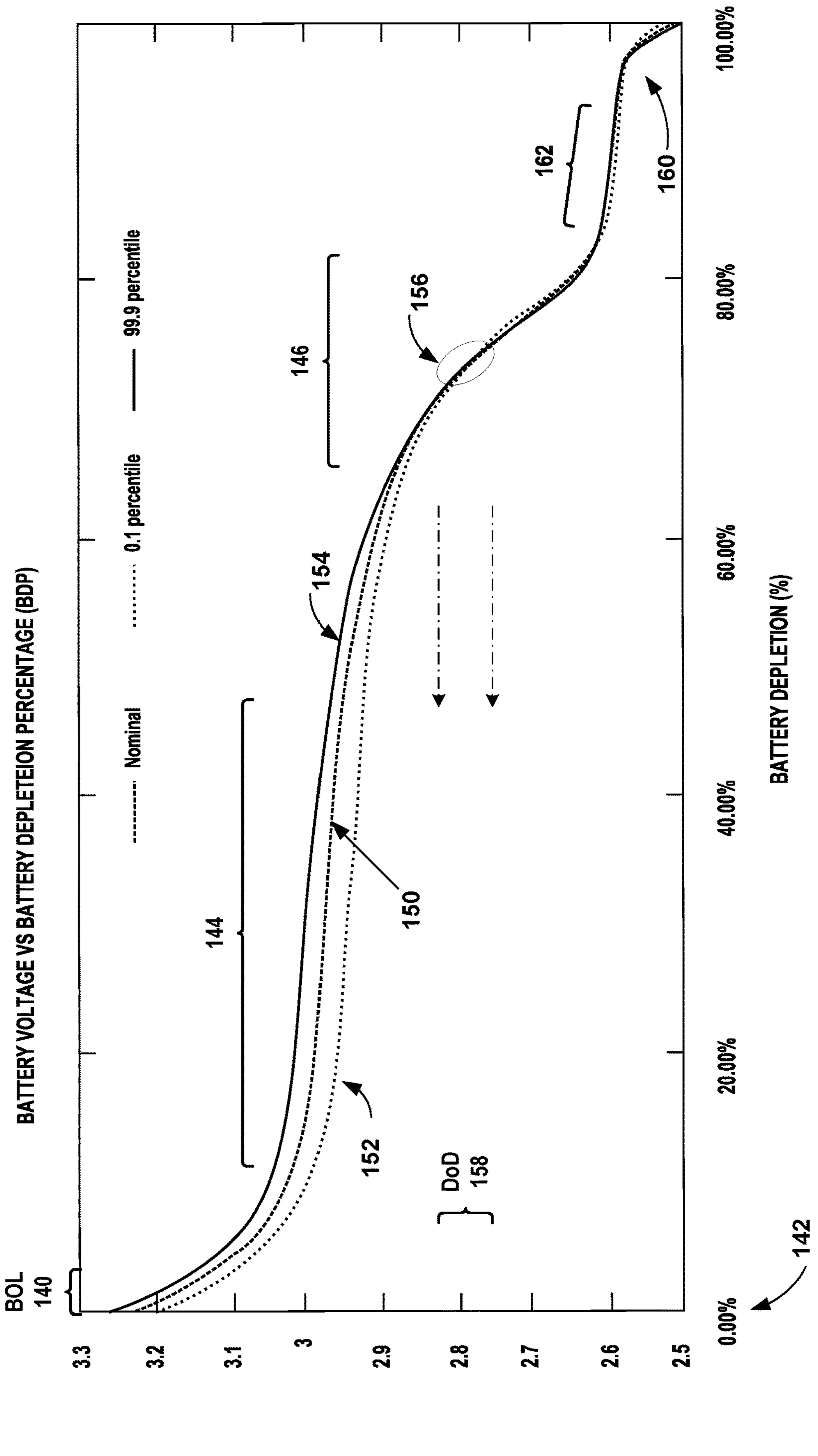
FIG. 2B is a graph illustrating an example battery discharge curve in battery voltage vs. percent depth of discharge.

FIG. 2B is a graph illustrating an example battery discharge curve in battery voltage vs. percent depth of discharge. Similar to FIG. 2A, the example of FIG. 2B shows battery run-down testing but with the battery voltage plotted as the battery depletion percentage (BDP) increases. Battery depletion percentage may also be called percent depth of discharge (% DoD), as described above. A new battery may start at zero percent discharge, and a fully discharged battery may be at 100% depth of discharge. As described above in relation to FIG. 2A, the end of service life 160 for a battery may be determined by the load requirements and may be less than 100% depth of discharge. In other examples, 100% depth of discharge may be normalized to a predetermined voltage, e.g., a voltage magnitude at which the load may perform as expected, and therefore 100% depth of discharge may be the end of service life 160.

In the example of FIG. 2B, the battery discharge curves are all normalized to have a 100% depth of discharge at 2.5V. That is, 2.5V may be considered to end of service life of the battery. In contrast to the divergent behavior shown in FIG. 2A, in the example of FIG. 2B, at a shared voltage 156 of approximately 2.75V, all the curves line up at about 78% depth of discharge. The example of FIG. 2B shows that variability from battery to battery is very low, e.g., there is little to no difference between the nominal curve 150, the 0.1 percentile curve 152 and the 99.9 percentile curve 154 at the shared voltage magnitude 156. In other words, each of the non-rechargeable batteries in the population have a characteristic to converge at the shared voltage magnitude 156 prior to end of service life 160 and each having a same estimated percent depth of discharge (% DoD) at the shared voltage magnitude 156. Said another way, the shared voltage magnitude is approximately the same magnitude for each non-rechargeable battery in the population of non-rechargeable batteries without regard to manufacturing variability for the population of non-rechargeable batteries. Shared voltage magnitude 156 may also be referred to as shared voltage 156. In this disclosure, "approximately the same magnitude" means the values are equal, within manufacturing and measurement equipment tolerances. In this disclosure, the term depth of discharge may be assumed to mean percent depth of discharge, as defined above and the depth of discharge may indicate an amount of battery capacity remaining for a battery in the population of batteries.

The shared voltage magnitude 156 at which each battery in the population of batteries is on a 'steep' portion 146 of the battery discharge curves 150, 152 and 154. As described above in relation to FIG. 2A, determining a specific remaining battery capacity, or depth of discharge (also referred to as DoD, in this disclosure) may be more accurate at the steep portions of the curve, e.g., 146 or BOL 140, than during the 'flat' portions of the battery discharge curve, e.g., 144 and 162.

For medical devices, an elective replacement indicator (ERI) is a required feature of the device to notify the patient that the battery and/or device should be replaced soon. The elective replacement indicator may also be referred to as an early replacement indicator. Processing circuitry of a device, such as IMD 16 described above in relation to FIG. 1, may execute programming instructions to cause an output of ERI that provides enough time for a patient, and healthcare provider, to schedule a replacement for the medical device. As described above in relation to FIG. 1, in some examples, replacement may require surgery.

In some examples, processing circuitry may receive an indication of the battery voltage, e.g., from a battery voltage sensor, and compare the measured battery voltage to a battery voltage threshold. In some examples the battery voltage threshold may be a voltage that approximately equals the shared voltage magnitude 156. The measured battery voltage may satisfy the battery voltage threshold when the measured battery voltage is less than the battery voltage threshold. In other examples, the battery voltage threshold may be a range of voltages that includes the shared voltage magnitude 156. The measured battery voltage may satisfy the battery voltage threshold when the measured battery voltage is within the range of voltages. In other words, the battery voltage threshold may be based on a guard band associated with the shared voltage magnitude 156.

In some examples, processing circuitry associated with 1 MB 16 may calculate the amount of time remaining before the end of service life 160. The processing circuitry may calculate the amount of time remaining based on an estimation that a first usage rate from beginning of life BOL 140 to a depth of discharge, DoD 158, which the sensor indicates that the battery voltage satisfies the battery voltage threshold, will be substantially the same as a second usage rate from when the battery voltage satisfies the battery voltage threshold to the end of service life 160. In other words, as described above in relation to FIG. 1, the processing circuitry may calculate the amount of time remaining based on an estimated usage rate that is approximately constant through the battery life. As noted in FIG. 1, the usage rate may vary during wireless communication, during on-periods and off-periods of delivering electrical stimulation therapy and so on. In this disclosure, "approximately constant" means constant, within some range of variation, or may refer to an average usage rate, or some other measurement of central tendency for usage rate.

In some examples, depth of discharge, DoD 158, which the sensor indicates that the battery voltage satisfies the battery voltage threshold may be a range of values, as shown in the example of FIG. 2B. In other examples, DoD 158 may be a single value, e.g., stored at a memory location operatively coupled to the processing circuitry. Because DoD 158 is an indication of the percent of battery capacity remaining, of the initial battery capacity, processing circuitry, e.g., of system 10, may estimate an amount of time remaining based on the usage rate of the circuitry supplied by the battery and the percent of battery capacity remaining.

Processing circuitry of this disclosure may measure the charge used from zero percent (0%) depletion to the point where the battery voltage is at the shared voltage 156, which in the example of FIG. 2B is 2.75V. At the shared voltage 156, the processing circuitry associated with the medical device may base calculations on a known DoD 158, which in the example of FIG. 2B is 78% of the capacity is used and there is 22% battery capacity remaining. In some examples, the "charge" may be based on actual current used by the device, e.g., as measured by a coulomb counter or similar sensor. If the processing circuitry uses a known, measured, actual current, the depth of discharge could now be 'recalibrated' to use the updated capacity for the battery based on DoD 158 at the shared voltage 156. In other examples, the calculations may be based on the elapsed time from BOL 140 (0% DoD) to satisfy the voltage threshold, e.g., reach the shared voltage magnitude 156 (approximately 2.75V in the example of FIG. 2B). As described above in relation to FIG. 2A, in some examples, a coulomb counter may be less desirable because the coulomb counter may consume some battery capacity to operate, which without a coulomb counter, may be available to extend the battery life of a device.

In some examples, programming instructions may cause the processing circuitry to calculate the amount of time remaining before the end of service life 160 of the non-rechargeable battery according to: $X*(1-Y)/Y$. In the example of FIG. 2B, X is the amount of time from beginning of life BOL 140 to a time the processing circuitry received the indication from the sensor that the measured battery voltage equals the shared voltage magnitude 156. In FIG. 2B, Y is the percent depth of discharge, % DoD 158, at which the measured battery voltage equals the shared voltage magnitude.

In some examples, the processing circuitry may cause the output of the ERI based on the calculated an amount of time remaining before end of service life 160. The amount of time may be set such that the patient has time to schedule a replacement, e.g., weeks or months before the estimated end of service life 160. In some examples, the processing circuitry may be configured to output the elective replacement indication at a time in which the processing circuitry received the indication from the sensor that the measured battery voltage satisfies the battery voltage threshold, e.g., that the battery voltage is equal, or approximately equal, to the shared voltage 156. For example, for some battery chemistries, such as in the example of 2B, when a battery measures the shared voltage 156, the % DoD is approximately equal to 78% of the battery capacity consumed. The processing circuitry may execute programming instructions to output ERI at the 78% DoD. In other examples, the processing circuitry may cause the output of ERI at 80%, 85% DoD, or some other value after measuring the shared voltage 156. In some examples, the processing circuitry may output the indication of ERI based on the battery voltage satisfying a voltage magnitude threshold that is less than magnitude of shared voltage 156.

In some examples outputting ERI may be based on a time remaining, which combines the remaining capacity and measured current. In some examples, the processing circuitry may be configured to output an indication of end of service life 160 based on a calculated duration after the processing circuitry outputs the indication of the elective replacement indicator. In other examples, the processing circuitry may be configured to output an indication of end of service life based on the measured battery voltage satisfying an end of service life threshold stored in a look-up table at the memory and after the processing circuitry outputs the indication of the elective replacement indicator. In other examples, the processing circuitry may only output an indication of ERI and make no further estimates of an indication of end of service life.

In this manner the techniques of this disclosure may provide a more accurate battery longevity, because by using the shared voltage magnitude 156, battery variability is less of a factor, compared to other techniques. Therefore, the processing circuitry may calculate a more accurate ERI and EOS (End of Service) based on these techniques. A more accurate calculation could provide longer implant life to the patient, because the techniques of this disclosure may not need to account for the low end of the available capacity range 108, described above in relation to FIG. 2A. The method to determine battery longevity with a timer may reduce the complexity of the firmware on the device and increase the life of the device by not requiring an active coulomb counter (current measurement circuit).

Figure 3:
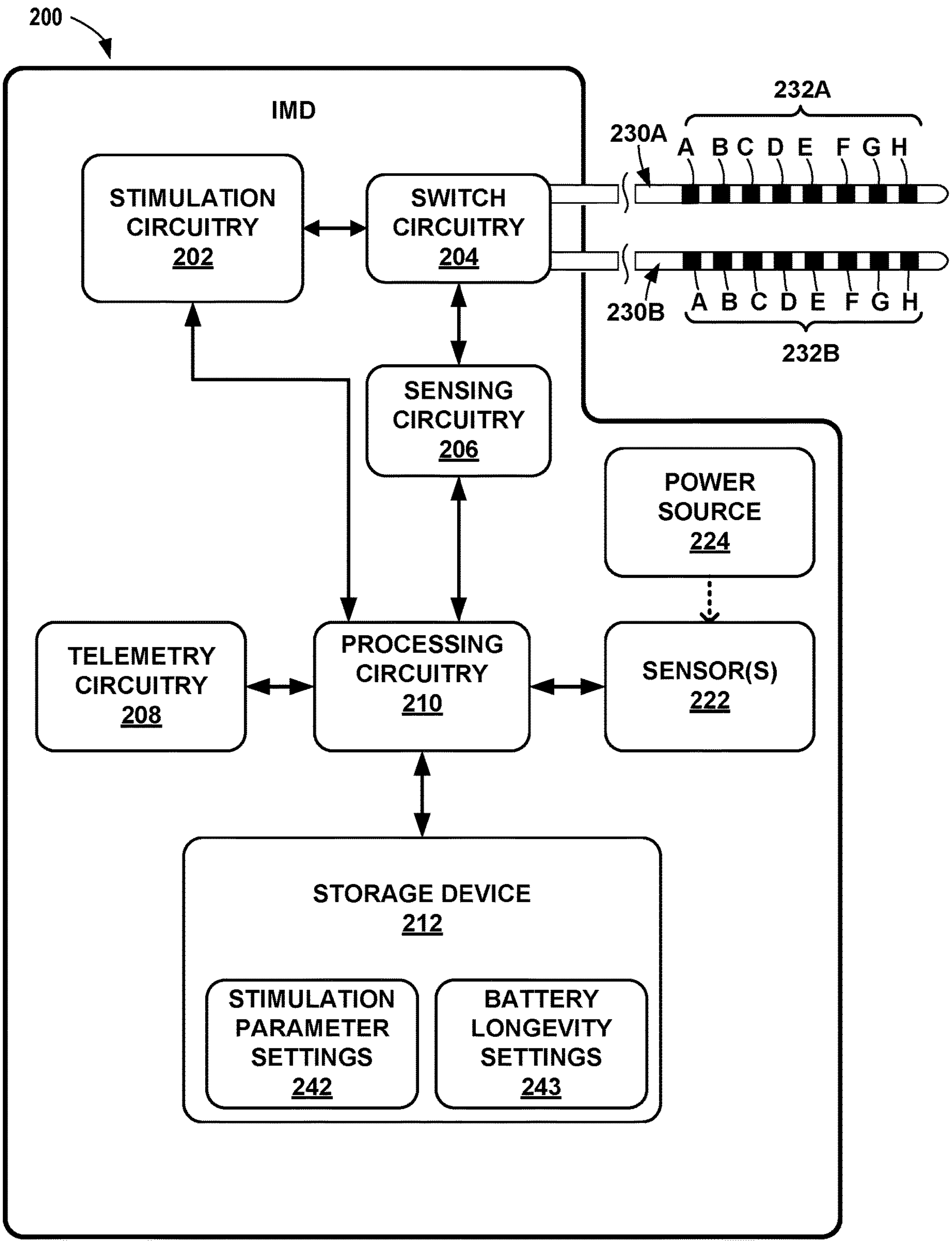
FIG. 3 is a block diagram illustrating an example configuration of components of the IMD of FIG. 1, in accordance with one or more techniques of this disclosure.

FIG. 3 is a block diagram illustrating an example configuration of components of the IMD of FIG. 1, in accordance with one or more techniques of this disclosure. IMD 200 may be an example of IMD 16 of FIG. 1. In the examples shown in FIG. 3, IMD 200 includes stimulation generation circuitry 202, switch circuitry 204, sensing circuitry 206, telemetry circuitry 208, sensor(s) 222, power source 224, lead 230A carrying electrodes 232A, which may correspond to one of leads 18, 20, 28 and electrodes 19, 21, 29 of FIG. 1, and lead 230B carrying electrodes 232B, which may correspond to another one of leads 18, 20, 28 and electrodes 19, 21, 29 of FIG. 1. In the examples shown in FIG. 2, IMD 200 includes processing circuitry 210 and storage device 212. Processing circuitry 210 may include one or more processors configured to perform various operations of IMD 200.

In the examples shown in FIG. 3 storage device 212 may store stimulation parameter settings 242 and battery longevity settings 243. Battery longevity settings 243 may cause processing circuitry 210 to perform the actions described above in relation to FIGS. 1-2B. For example, battery longevity settings 243 may include the battery voltage threshold based on shared voltage magnitude 156 of FIG. 2B. Processing circuitry 210 may be configured to execute instructions stored at battery longevity settings 243 and calculate the amount of time remaining before the end of service life 160 of power source 224, based on receiving an indication from the sensors 222 that the measured battery voltage satisfies the stored battery voltage threshold. As described above in relation to FIGS. 1 and 2B, the shared voltage magnitude 156 indicates a percent DoD, e.g., a percent of total battery capacity used. Processing circuitry 210 may calculate an amount of time remaining based on the current and/or expected usage rate of the circuitry of IMD 200, and the amount of battery capacity remaining of the initial, beginning of life, battery capacity.

In some examples, stimulation parameter settings 242 may include stimulation parameters (sometimes referred to as "sets of therapy stimulation parameters") for respective different stimulation programs selectable by the clinician or patient for therapy. In some examples, stimulation parameter settings 242 may include one or more recommended parameter settings. In this manner, each stored therapy stimulation program, or set of stimulation parameters, of stimulation parameter settings 242 defines values for a set of electrical stimulation parameters (e.g., a stimulation parameter set), such as electrode combination (selected electrodes and polarities), stimulation current or voltage amplitude, stimulation pulse width, and pulse frequency. The selected stimulation parameters may affect the usage rate of electrical energy stored at power source 224 and may affect the amount of time between beginning of life and the end of service life, as described above in relation to FIGS. 2A and 2B. For example, higher amplitude pulses, wider pulse width and more on-time vs. off-time for the stimulation parameter settings 242 could increase the usage rate and decrease the time between BOL and EOS.

In some examples, stimulation parameter settings 242 may indicate for the stimulation to turn on for a certain period of time, and/or to turn off stimulation for a certain period of time. For example, stimulation parameter settings 242 may further include cycling information indicating when or how long stimulation is turned on and off, e.g., periodically and/or according to a schedule. For example, electrical stimulation may be delivered as a series of electrical stimulation pulses, each pulse being defined by an amplitude, a frequency, a pulse width and/or duration, and an electrical combination (e.g., stimulation pulse parameters). Cycling parameters may define how the series of pulses is delivered. For example, stimulation cycling parameters may include a cycling frequency or period and a duty cycle or ratio of how long electrical stimulation pulses are delivered according to the cycling frequency (an "on-time") to how long electrical stimulation is not delivered (an "off-time). In other examples, cycling may include a schedule defining the specific times at which electrical stimulation pulses are to be delivered according to specific stimulation pulse parameter settings.

In some examples, cycling and/or a schedule may include variation over time of any of the electrode combination, amplitude, pulse frequency, pulse width, cycling frequency, and cycling duty cycle, such as a taper in which a parameter is decreased and/or increased. As one specific example of just two parameters, a cycling parameter may include a constant or variable rate of decrease of the amplitude of the pulses and the duty cycle (e.g., a decrease in the on-time/off-time ratio). In some examples, stimulation parameter settings 242 may further include other information and/or limits to other stimulation parameter settings, e.g., such as stimulation pulse or cycling parameter settings limits to deliver electrical stimulation therapy without creating, or to reduce, desensitization of the patient to the electrical stimulation. In some examples, stimulation parameter settings 242 may indicate stimulation to occur at a certain time of day, for example when the patient is typically awake or active, or sleeping. In some examples, stimulation parameter settings 242 relate to when the patient has a certain posture, for example only deliver stimulation when the patient is in a supine position.

In some examples, an electrical stimulation signal may comprise electrical stimulation delivered according to one or more electrical stimulation parameter settings 242, e.g., electrical stimulation delivered according to stimulation pulse parameters settings, stimulation cycling parameters settings, and/or any other suitable stimulation parameters settings, information, limits, or conditions.

Stimulation generation circuitry 202 includes electrical stimulation circuitry configured to generate electrical stimulation and generates electrical stimulation pulses selected to alleviate symptoms of one or more diseases, disorders, or syndromes. While stimulation pulses are described, stimulation signals may take other forms, such as continuous-time signals (e.g., sine waves) or the like. The electrical stimulation circuitry may reside in an implantable housing, for example of the IMD. Each of leads 230A, 230B may include any number of electrodes 232A, 232B. The electrodes are configured to deliver the electrical stimulation to the patient. In the example of FIGS. 2A and 2B, each set of electrodes 232A, 232B includes eight electrodes A-H. In some examples, the electrodes are arranged in bipolar combinations. A bipolar electrode combination may use electrodes carried by the same lead 230A, 230B or different leads. For example, an electrode A of electrodes 232A may be a cathode and an electrode B of electrodes 232A may be an anode, forming a bipolar combination.

Switch circuitry 204 may include one or more switch arrays, one or more multiplexers, one or more switches (e.g., a switch matrix or other collection of switches), or other electrical circuitry configured to direct stimulation signals from stimulation generation circuitry 202 to one or more of electrodes 232A, 232B, or directed sensed signals from one or more of electrodes 232A, 232B to sensing circuitry 206. In some examples, each of the electrodes 232A, 232B may be associated with respective regulated current source and sink circuitry to selectively and independently configure the electrode to be a regulated cathode or anode. Stimulation generation circuitry 202 and/or sensing circuitry 206 also may include sensing circuitry to direct electrical signals sensed at one or more of electrodes 232A, 232B.

Sensing circuitry 206 may be configured to monitor signals from any combination of electrodes 232A, 232B and/or sensor(s) 222. In some examples, sensing circuitry 206 includes one or more amplifiers, filters, and analog-to-digital converters. Sensing circuitry 206 may be used to sense stimulation-evoked and/or physiological signals, such as ECAP signals, EMG signals, and the like. In some examples, sensing circuitry 206 detects ECAP and/or EMG signals from a particular combination of electrodes 232A, 232B. In some cases, the particular combination of electrodes for sensing ECAP and/or EMG signals includes different electrodes than a set of electrodes 232A, 232B used to deliver stimulation pulses. Alternatively, in other cases, the particular combination of electrodes used for sensing ECAP and/or EMG signals includes at least one of the same electrodes as a set of electrodes used to deliver stimulation pulses to patient 14. Sensing circuitry 206 may provide signals to an analog-to-digital converter, for conversion into a digital signal for processing, analysis, storage, or output by processing circuitry 210. In some examples, sensing circuitry 206 may sense and/or detect stimulation-evoked signals and/or composite stimulation-evoked signals comprising one or more of an ECAP, an EMG or surface EMG, an MMG, a network excitability, and/or multiple signals of differing signal type evoked by one or more signal sources such as sacral nerves, e.g., dorsal and ventral rami of sacral nerves, pudendal nerves, sciatic nerves, saphenous nerves, nerves in the sacral plexus, pelvic nerves, pelvic plexus nerves, pelvic splanchnic nerves, inferior hypogastic plexus nerves, lumbosacral trunk nerves, e.g., where the lumbosacral trunk joins sacral nerves, any sympathetic nerve fibers in the sympathetic chain of any of the above nerves or other nerves, muscles such as an external anal sphincter muscle, coccygeus muscle, levator ani muscle group, bulbocavernosus and/or bulbospongiosus muscle, gluteal muscles, e.g., gluteal maximus, gluteal medius, and gluteal minimus, perineal muscles, ischiocavernosus muscles, puborectalis muscles, piriformis muscles, or any other muscles.

In addition to measuring battery voltage, and in some examples the electrical current, flowing from power source 224, sensor(s) 222 may be configured to sense one or more physiological responses of a patient, e.g., patient 14. In some examples, portions of sensor(s) 222 may be substantially the same as sensor(s) 15, 22 described above with reference to FIG. 1, for example, sensors 222 may include one or more accelerometers configured to detect movement and/or patient position. In some examples, sensors 222 may include other sensors located at one or more other positions on patient 14, e.g., located at or near one or more muscles and or nerves, or located at positions on patient 14 which may be relatively far from a signal source, e.g., a nerve or muscle.

Telemetry circuitry 208 supports wireless communication between IMD 200 and an external programmer or another computing device under the control of processing circuitry 210. Processing circuitry 210 of IMD 200 may receive, as updates to programs, values for various stimulation parameters such as amplitude and electrode combination, from the external programmer via telemetry circuitry 208. Processing circuitry 210 may store updates to the stimulation parameter settings 242 or any other data in storage device 212. Telemetry circuitry 208 in IMD 200 as well as telemetry circuits in other devices and systems described herein, such as the external programmer and patient feedback sensing system, may accomplish communication by radiofrequency (RF) communication techniques. In addition, telemetry circuitry 208 may communicate with an external medical device programmer via proximal inductive interaction of IMD 200 with the external programmer, where the external programmer may be one example of external device 24 of FIG. 1. Accordingly, telemetry circuitry 208 may send information to the external programmer on a continuous basis, at periodic intervals, or upon request from IMD 16 and/or external device 24 as described above in relation to FIG. 1.

Processing circuitry 210 may include one or more processors, such as any one or more of a programmable processor, a microprocessor, a controller, a digital signal processor (DSP), an application specific integrated circuit (ASIC), a field-programmable gate array (FPGA), discrete logic circuitry, or any other processing circuitry configured to provide the functions attributed to processing circuitry 210 herein may be embodied as firmware, hardware, software, or any combination thereof. Processing circuitry 210 controls stimulation generation circuitry 202 to generate stimulation signals according to stimulation parameter settings 242. In some examples, processing circuitry 210 may execute other instructions stored in storage device 212, respectively, to apply stimulation parameters specified by one or more of programs, such as electrode combination or configuration, electrode polarity, amplitude, pulse width, pulse shape, pulse frequency or pulse rate, or cycling of each of the stimulation signals. Storage device 212 may also store instructions related to the various techniques to output ERI, described above in relation to FIG. 2B, such as to output the elective replacement indication at a predetermined calculated time remaining before the end of service life. The predetermined calculated time remaining may be based on the amount, e.g., a percent, of battery capacity remaining, such as when at the common battery voltage 156 depicted in FIG. 2B, and the usage rate from when the battery voltage satisfies the battery voltage threshold to the end of service life.

Processing circuitry 210 may control stimulation generation circuitry 202 to generate and apply the stimulation signals to selected combinations of electrodes 232A, 232B. In some examples, stimulation generation circuitry 202 includes a switch circuit (instead of, or in addition to, switch circuitry 204) that may couple stimulation signals to selected conductors within leads 230, which, in turn, deliver the stimulation signals across selected electrodes 232A, 232B. Such a switch circuit may selectively couple stimulation energy to selected electrodes 232A, 232B and to selectively sense bioelectrical neural signals of a sacral nerve or muscles of the patient with selected electrodes 232A, 232B. In other examples, however, stimulation generation circuitry 202 does not include a switch circuit and switch circuitry 204 does not interface between stimulation generation circuitry 202 and electrodes 232A, 232B. In these examples, stimulation generation circuitry 202 may include a plurality of pairs of current sources and current sinks, each connected to a respective electrode of electrodes 232A, 232B. In other words, in these examples, each of electrodes 232A, 232B is independently controlled via its own stimulation circuit (e.g., via a combination of a regulated current source and sink), as opposed to switching stimulation signals between different electrodes of electrodes 232A, 232B.

Storage device 212 may be configured to store information within IMD 200 during operation. Storage device 212 may include a computer-readable storage medium or computer-readable storage device. In some examples, storage device 212 includes one or more of a short-term memory or a long-term memory. Storage device 212 may include, for example, random access memories (RAM), dynamic random access memories (DRAM), static random access memories (SRAM), magnetic discs, optical discs, flash memories, or forms of electrically programmable memories (EPROM) or electrically erasable and programmable memories (EEPROM). In some examples, storage device 212 is used to store data indicative of instructions, e.g., for execution by processing circuitry 210, respectively. As discussed above, storage device 212 may be configured to store stimulation parameter settings 242, as well as the battery longevity calculation instructions and settings described above in relation to FIGS. 1-2B.

Power source 224 is configured to deliver operating power to the components of IMD 200. Power source 224 may include a battery and a power generation circuit to produce the operating power. In some examples, the battery is rechargeable to allow extended operation. In some examples, recharging is accomplished through proximal inductive interaction between an external charger and an inductive charging coil within IMD 200. In some examples, power source 224 may include any one or more of a plurality of different battery types, such as nickel cadmium batteries and lithium ion batteries. In other examples, power source 224 may include non-rechargeable, or primary cell batteries, or other types of electrical energy storage, as described above in relation to FIG. 2A.

In some examples as shown in FIG. 3, the processing circuitry 210 directs delivery of electrical stimulation by the electrodes 232A, 232B of leads 230A, 230B, receives stimulation-evoked signal data and/or information from sensors 222, and generates output based on the received data and/or information. For example, a particular cycling and/or a set of stimulation parameters are recommended to a user and presented to the user via the programmer. The user may accept the recommended cycling and/or one or more recommended stimulation parameters, and the programmer programs IMD 200 to implement and deliver stimulation with the selected electrode combination and/or stimulation parameters.

Processing circuitry 210 may control stimulation circuitry 202 to deliver stimulation energy with stimulation parameters specified by one or more stimulation parameter settings 242 stored on storage device 212 and, in some examples collect stimulation-evoked signals pertaining to the stored stimulation parameter settings 242. Processing circuitry 210 may collect this stimulation-evoked signal information and/or composite stimulation-evoked signal information by receiving the information via sensing circuitry 206 and/or sensors 222.

Figure 4:
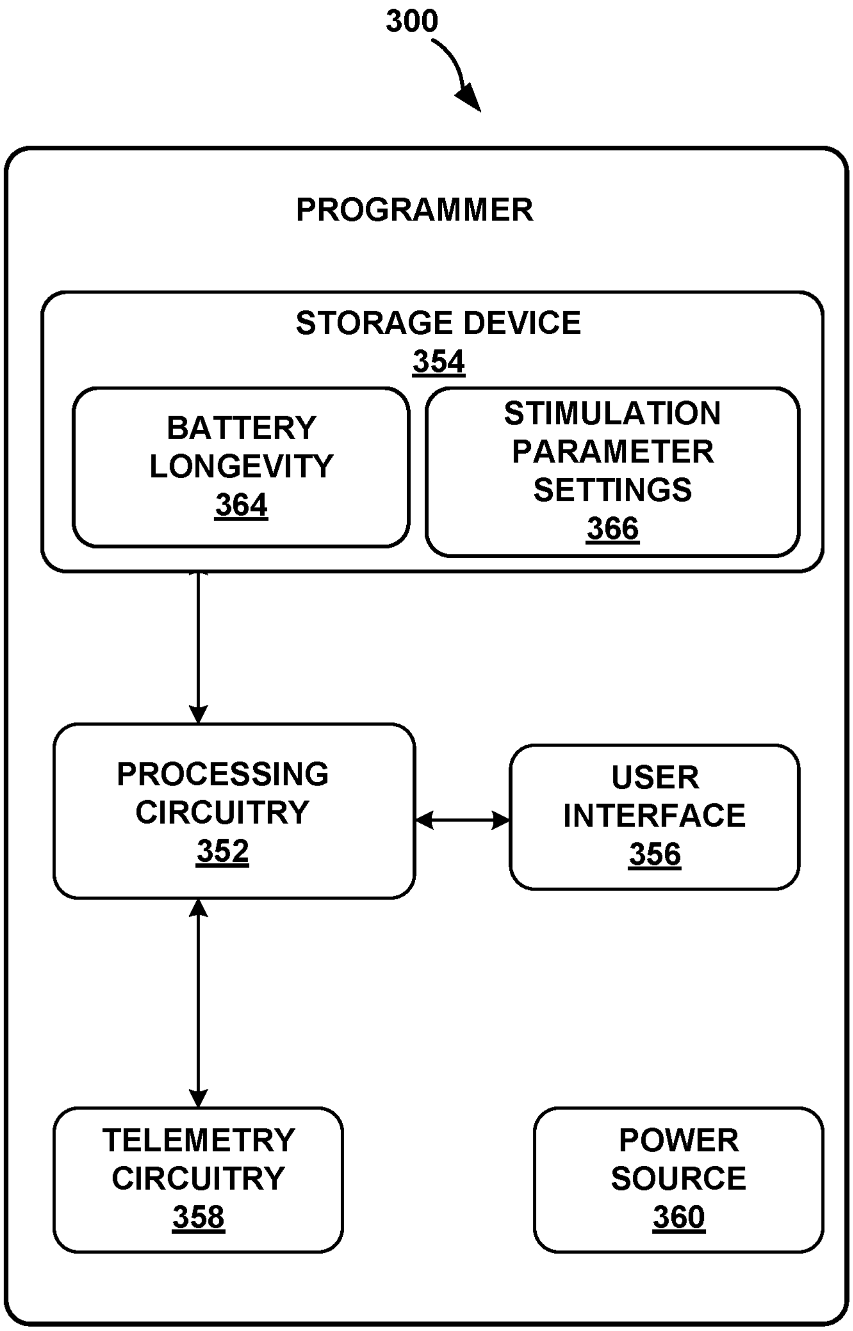
FIG. 4 is a block diagram illustrating an example configuration of components of the external programmer of FIG. 1, in accordance with one or more techniques of this disclosure.

FIG. 4 is a block diagram illustrating an example configuration of components of an example external computing device 300. External computing device 300 may be an example of external device 24 of FIG. 1 and may also be referred to as an external programmer in this disclosure. Although external computing device 300 may generally be described as a hand-held device, such as a tablet computer or smartphone-like device, external computing device 300 may be a larger portable device, such as a laptop computer, or a more stationary device, such as a desktop computer. In addition, in other examples, external programmer 300 may be included as part of an external charging device or include the functionality of an external charging device, e.g., to recharge a battery or batteries associated with IMD 200. As illustrated in FIG. 4, external programmer 300 may include processing circuitry 352, storage device 354, user interface 356, telemetry circuitry 358, and power source 360. In some examples, storage device 354 may store instructions that, when executed by processing circuitry 352, cause processing circuitry 352 and external programmer 300 to provide the functionality ascribed to external programmer 300 throughout this disclosure. Each of these components, circuitry, or modules, may include electrical circuitry that is configured to perform some, or all of the functionality described herein. For example, processing circuitry 352 may include processing circuitry configured to perform the processes discussed with respect to processing circuitry 352.

In general, external programmer 300 includes any suitable arrangement of hardware, alone or in combination with software and/or firmware, to perform the techniques attributed to external programmer 300, and processing circuitry 352, user interface 356, and telemetry circuitry 358 of external programmer 300. In various examples, processing circuitry 352, telemetry circuitry 358, or other circuitry of external programmer 300 may include one or more processors, such as one or more microprocessors, DSPs, ASICs, FPGAs, or any other equivalent integrated or discrete logic circuitry, as well as any combinations of such components. External programmer 300 also, in various examples, may include a storage device 354, such as RAM, ROM, PROM, EPROM, EEPROM, flash memory, a hard disk, a CD-ROM, including executable instructions for causing the one or more processors to perform the actions attributed to them. Moreover, although processing circuitry 352 and telemetry circuitry 358 are described as separate modules, in some examples, processing circuitry 352 and telemetry circuitry 358 are functionally integrated. In some examples, processing circuitry 352, telemetry circuitry 358 or other circuitry of external programmer 300 may correspond to individual hardware units, such as ASICs, DSPs, FPGAs, or other hardware units.

The processing circuitry 352 is configured to direct delivery of electrical stimulation, receive information relating to one or more stimulation-evoked signal(s). In some examples, the processing circuitry 352 is configured to control the electrical stimulation circuitry to deliver the electrical stimulation based on the received stimulation-evoked signal information in a closed loop basis by directing the IMD to use particular stimulation parameters.

In some examples, storage device 354 may include instructions that cause processing circuitry 352 to obtain a parameter set from memory or receive user input and send a corresponding command to IMD 200, or instructions for any other functionality such as instructions or data related to battery longevity 364. In addition, storage device 354 may include a plurality of programs, where each program includes a parameter set that defines therapy stimulation or control stimulation. Storage device 354 may also store data received from a medical device (e.g., IMD 16) and/or a remote sensing device. For example, storage device 354 may store data recorded at a sensing module of the medical device, and storage device 354 may also store data from one or more sensors of the medical device. In an example, storage device 354 may store data recorded at a remote sensing device such as one or more stimulation-evoked signal sensed by one or more sensors.

In some examples, processing circuitry 352, which is associated with IMD 16 and IMD 200 described above in relation to FIGS. 1 and 3, may perform one or more of the battery longevity calculations described above in relation to FIGS. 1-3. For example, processing circuitry 352 may receive an indication of the battery usage rate for IMD 16 and may receive an indication of the sensed battery voltage for IMD 16, e.g., via telemetry circuitry 358. Processing circuitry 352 may compare the received battery voltage to a battery voltage threshold based on a shared voltage magnitude, which may be stored at storage device 354. Processing circuitry 352 may calculate an amount of time remaining before the end of service life of power source 224 of IMD 16, of FIGS. 1 and 3. In some examples, the calculation may be based on receiving the indication from the sensor that the measured battery voltage satisfies the battery voltage threshold, and/or based on the comparison of the received battery voltage to the battery voltage threshold stored at storage device 354. The time remaining may also be based on the usage rate of the battery capacity received from IMD 16. In some examples, processing circuitry 352 may cause user interface 356 to output an elective replacement indicator (ERI) based on the calculation. In other examples, processing circuitry 352 may cause user interface 356 to output the elective replacement indicator based on receiving an indication from IMD 16 of the elective replacement indicator.

User interface 356 may include a button or keypad, lights, a speaker for voice commands, a display, such as a liquid crystal (LCD), light-emitting diode (LED), or organic light-emitting diode (OLED). In some examples, the display includes a touch screen. User interface 356 may be configured to display any information related to the delivery of electrical stimulation including output, for example, information based on one or more stimulation-evoked signal. User interface 356 may also receive user input (e.g., indication of when the patient perceives stimulation, or a pain score perceived by the patient upon delivery of stimulation) via user interface 356. The user input may be, for example, in the form of pressing a button on a keypad or selecting an icon from a touch screen. The input may request starting or stopping electrical stimulation, the input may request a new electrode combination or a change to an existing electrode combination, or the input may request some other change to the delivery of electrical stimulation, such as a change in electrode combination or configuration, electrode polarity, amplitude, pulse width, pulse shape, pulse frequency or pulse rate, or cycling.

Telemetry circuitry 358 may support wireless communication between the medical device and external programmer 300 under the control of processing circuitry 352. Telemetry circuitry 358 may also be configured to communicate with another computing device via wireless communication techniques, or direct communication through a wired connection. In some examples, telemetry circuitry 358 provides wireless communication via an RF or proximal inductive medium. In some examples, telemetry circuitry 358 includes an antenna, which may take on a variety of forms, such as an internal or external antenna.

Examples of local wireless communication techniques that may be employed to facilitate communication between external programmer 300 and IMD 16 include RF communication according to the 802.11 or Bluetooth® specification sets or other standard or proprietary telemetry protocols. In this manner, other external devices may be capable of communicating with external programmer 300 without needing to establish a secure wireless connection. As described herein, telemetry circuitry 358 may be configured to transmit a spatial electrode movement pattern or other stimulation parameters to IMD 16 for delivery of electrical stimulation therapy.

Power source 360 is configured to deliver operating power to the components of external programmer 300. Power source 360 may include a battery and a power generation circuit to produce the operating power. In some examples, the battery is rechargeable to allow extended operation. Recharging may be accomplished by electrically coupling power source 360 to a cradle or plug that is connected to an alternating current (AC) outlet. In addition, recharging may be accomplished through proximal inductive interaction between an external charger and an inductive charging coil within external programmer 300. In other examples, traditional batteries (e.g., nickel cadmium or lithium ion batteries) may be used. In addition, external programmer 300 may be directly coupled to an alternating current outlet to operate.

In some examples, the external programmer 300 directs delivery of electrical stimulation of an IMD, receives information relating to stimulation-evoked signals and/or composite stimulation-evoked signals, and generates output based on the received information, e.g., for evaluation of efficacy of stimulation parameters and/or to recommend or assist a user in programming stimulation parameters for delivery of electrical stimulation, or used as part of a closed loop control scheme to automatically adjust stimulation parameters using stimulation-evoked signal information and/or composite stimulation-evoked signal information. In one or more examples, the external programmer 300 generates output based on stimulation-evoked signal information, e.g., output which may be used as part of closed loop control, output which may be displayed and used by external programmer 300 to manually control therapy delivery, output which may be used to maintain delivery of the same therapy, output which may be recorded and tracked, or output which may be suitable for any other purpose relating to delivery of electrical stimulation therapy.

The architecture of external programmer 300 illustrated in FIG. 4 is shown as an example. The techniques as set forth in this disclosure may be implemented in the example external programmer 300 of FIG. 4, as well as other types of systems not described specifically herein. Nothing in this disclosure should be construed so as to limit the techniques of this disclosure to the example architecture illustrated by FIG. 4.

Figure 5:
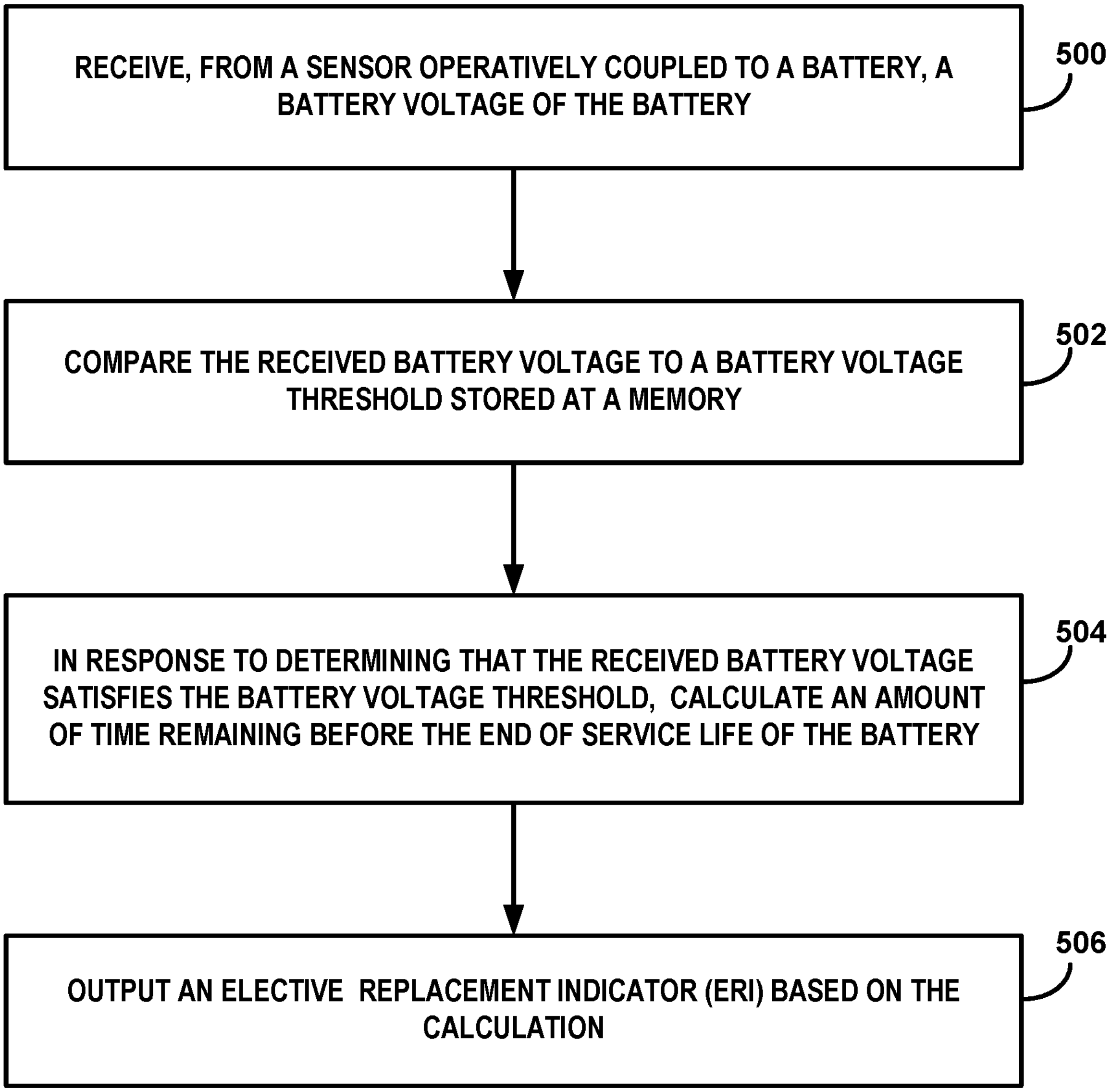
FIG. 5 is a flow chart illustrating an example operation of a device executing the techniques of this disclosure.

FIG. 5 is a flow chart illustrating an example operation of a device executing the techniques of this disclosure to operate a battery powered medical device. The blocks of FIG. 5 may be described in terms of FIGS. 1-4 above.

Processing circuitry of a medical device, such as processing circuitry 210 may receive, from a sensor operatively coupled to a battery, a battery voltage of the battery (500). In the example of FIG. 2, the battery may be part of power source 224. The battery is one of a population of rechargeable or non-rechargeable, e.g., primary cell, batteries. The examples of FIGS. 2A and 2B depict battery discharge curves for a population of batteries.

Processing circuitry 210 may compare the received battery voltage to a battery voltage threshold stored at a memory operatively coupled to the processing circuitry (502), e.g., storage device 212. The battery voltage threshold may be based on a shared voltage magnitude, e.g., shared voltage 156 of FIG. 2B. Each of the non-rechargeable batteries in the population may have the characteristic for the received battery voltage to converge at the shared voltage magnitude prior to end of service life. Also, each battery may have the same estimated percent depth of discharge (% DoD) at the shared voltage magnitude.

In response to determining that the received battery voltage satisfies the battery voltage threshold, processing circuitry 210 may calculate an amount of time remaining before the end of service life of the battery (504). The calculation may be based on the estimated battery capacity remaining, e.g., the percent DoD, at the shared voltage magnitude and a usage rate of electrical energy output by the battery. As described above in relation to FIGS. 2A and 2B, processing circuitry 210 may determine the usage rate in several different ways, which may depend on whether or not IMD 16 includes a coulomb counter. In other examples, other processing circuitry associated with the medical device, such as processing circuitry 352 of external device 24 and/or server 26, may also calculate the amount of time remaining.

In some examples, processing circuitry 210 may cause an output of an elective replacement indicator (ERI) based on the calculation (506). The indication of ERI may be an audio signal, e.g., beeps from IMD 16, a vibration, an output to either or both of external device 24 or server 26, an output to a fitness tracker, mobile phone, tablet computer, or some other indication. In some examples, external device 25 may display the indication of ERI at user interface 356. For example, an implantable drug pump, or other battery powered device may include an audio alarm that may output a pattern of sounds that indicate ERI.

In one or more examples, the functions described above may be implemented in hardware, software, firmware, or any combination thereof. For example, the various components of FIGS. 3 and 4, such as processing circuitry 210, telemetry circuitry 208, processing circuitry 352 and so on, may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure.

A computer program product may include a computer-readable medium. The term "non-transitory" may indicate that the storage medium is not embodied in a carrier wave or a propagated signal. In certain examples, a non-transitory storage medium may store data that can, over time, change (e.g., in RAM or cache). By way of example, and not limitation, such computer-readable storage media, may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

The techniques of this disclosure may also be described in the following examples.

Example 1: An implantable medical device (IMD) comprising processing circuitry operatively coupled to a memory; a non-rechargeable battery that is one of a population of non-rechargeable batteries; and a sensor, operatively coupled to the processing circuitry, the sensor configured to measure a battery voltage of the non-rechargeable battery, wherein the memory is configured to store a battery voltage threshold based on a shared voltage magnitude, and wherein each of the non-rechargeable batteries in the population having a characteristic to converge at the shared voltage magnitude prior to end of service life and each having a same estimated percent depth of discharge (% DoD) at the shared voltage magnitude; and wherein the processing circuitry is configured to: calculate an amount of time remaining before the end of service life of the non-rechargeable battery, wherein the calculation is based on: receiving an indication from the sensor that the measured battery voltage satisfies the battery voltage threshold, and a usage rate of electrical energy output by the battery; and output an elective replacement indicator (ERI) based on the calculation.

Example 2: The device of example 1, wherein the processing circuitry is configured to determine the usage rate based on the % DoD used per unit time, and wherein the processing circuitry calculates the usage rate by dividing the used % DoD of the battery by a length of time since beginning of life.

Example 3: The device of any combination of examples 1 and 2: wherein the sensor comprises an electrical voltage sensor, the device further includes the measured battery electrical current magnitude; and the % DoD.

Example 4: The device of any combination of examples 1 through 3, wherein the usage rate is a first usage rate, and wherein to calculate the amount of time remaining, the processing circuitry is configured to calculate the amount of time remaining based on an estimation that the first usage rate from beginning of life (BOL) to a percent depth of discharge (% DoD) at which the sensor indicates that the battery voltage satisfies the battery voltage threshold, will be substantially the same as a second usage rate from when the battery voltage satisfies the battery voltage threshold to the end of service life.

Example 5: The device of example 4, wherein the processing circuitry is configured to output the elective replacement indication at a predetermined calculated time remaining before the end of service life, wherein the predetermined calculated time remaining is based on: the % DoD; and the second usage rate.

Example 6: The device of any combination of examples 1 through 5, wherein the processing circuitry is configured to calculate the amount of time remaining before the end of service life of the non-rechargeable battery according to: X*(1−Y)/Y, wherein: X is the amount of time from beginning of life (BOL) to a time the processing circuitry received the indication from the sensor that the measured battery voltage equals the shared voltage magnitude, and Y is a percent depth of discharge at which the measured battery voltage equals the shared voltage magnitude.

Example 7: The device of any combination of examples 1 through 6, wherein the processing circuitry is configured to output the elective replacement indication at a time in which the processing circuitry received the indication from the sensor that the measured battery voltage satisfies the battery voltage threshold.

Example 8: The device of any combination of examples 1 through 7, wherein the battery voltage threshold is based on a guard band associated with the shared voltage magnitude.

Example 9: The device of any combination of examples 1 through 8, wherein the non-rechargeable battery comprises SVO battery chemistry (or battery type).

Example 10: The device of any combination of examples 1 through 9, wherein the shared voltage magnitude is approximately the same magnitude for each non-rechargeable battery in the population of non-rechargeable batteries with manufacturing variability.

Example 11: The device of any combination of examples 1 through 10, wherein the processing circuitry is configured to output an indication of end of service life based on a calculated duration after the processing circuitry outputs the indication of the elective replacement indicator.

Example 12: The device of any combination of examples 1 through 11, wherein the processing circuitry is configured to output an indication of end of service life based on the measured battery voltage satisfying an end of service life threshold stored in a look-up table at the memory and after the processing circuitry outputs the indication of the elective replacement indicator.

Example 13: A system comprising at least one electrode configured to deliver the electrical stimulation to a patient; and a device includes a non-rechargeable battery that is one of a population of non-rechargeable batteries; a sensor, operatively coupled to the processing circuitry, the sensor configured to measure a battery voltage of the non-rechargeable battery; a memory configured to store a battery voltage threshold based on a shared voltage magnitude, and wherein each of the non-rechargeable batteries in the population having a characteristic to converge at the shared voltage magnitude prior to end of service life and each having a same estimated percent depth of discharge (% DoD) at the shared voltage magnitude; processing circuitry coupled to the memory, the processing circuitry configured to: deliver one or more electrical stimulation signal to the patient; calculate an amount of time remaining before the end of service life of the non-rechargeable battery, wherein the calculation is based on receiving an indication from the sensor that the measured battery voltage satisfies the battery voltage threshold, and a usage rate; and output an elective replacement indicator (ERI) based on the calculation.

Example 14: The system of example 13, wherein the processing circuitry is configured to determine the usage rate based on the % DoD used per unit time, and wherein the processing circuitry calculates the usage rate by dividing the % DoD by a length of time since beginning of life.

Example 15: The system of any of examples 13 and 14, wherein the sensor comprises an electrical voltage sensor, the device further includes the measured battery electrical current magnitude; and the % DoD.

Example 16: The system of any combination of examples 13 through 15, wherein the usage rate is a first usage rate, wherein to calculate the amount of time remaining, the processing circuitry is configured to calculate the amount of time remaining based on an estimation that the first usage rate from beginning of life (BOL) to a percent depth of discharge (% DoD), which the sensor indicates that the battery voltage satisfies the battery voltage threshold, will be substantially the same as a second usage rate from when the battery voltage satisfies the battery voltage threshold to the end of service life.

Example 17: The system of any combination of examples 13 through 16, wherein the processing circuitry is configured to output the elective replacement indication at a predetermined calculated time remaining before the end of service life, wherein the predetermined calculated time remaining is based on: the % DoD; and the second usage rate.

Example 18: The system of any combination of examples 13 through 17, wherein the processing circuitry is configured to calculate the amount of time remaining before the end of service life of the non-rechargeable battery according to: X*(1−Y)/Y, wherein: X is the amount of time from beginning of life (BOL) to a time the processing circuitry received the indication from the sensor that the measured battery voltage equals the shared voltage magnitude, and Y is a percent depth of discharge at which the measured battery voltage equals the shared voltage magnitude.

Example 19: The system of any combination of examples 13 through 18, wherein the processing circuitry is configured to output the elective replacement indication at a time in which the processing circuitry received the indication from the sensor that the measured battery voltage satisfies the battery voltage threshold.

Example 20: The system of any combination of examples 13 through 19, wherein the battery voltage threshold is based on a guard band associated with the shared voltage magnitude.

Example 21: The system of any combination of examples 13 through 20, wherein the non-rechargeable battery comprises SVO battery chemistry.

Example 22: The system of any combination of examples 13 through 21, wherein the shared voltage magnitude is approximately the same magnitude for each non-rechargeable battery in the population of non-rechargeable batteries with manufacturing variability.

Example 23: The system of any combination of examples 13 through 22, wherein the processing circuitry is configured to output an indication of end of service life based on a calculated duration after the processing circuitry outputs the indication of the elective replacement indicator.

Example 24: The system of any combination of examples 13 through 23, wherein the processing circuitry is configured to output an indication of end of service life based on the measured battery voltage satisfying an end of service life threshold stored in a look-up table at the memory and after the processing circuitry outputs the indication of the elective replacement indicator.

Example 25: A method for operating a battery powered medical device includes receiving, from a sensor operatively coupled to a non-rechargeable battery, a battery voltage of the non-rechargeable battery, wherein the non-rechargeable battery is one of a population of non-rechargeable batteries;

comparing, by processing circuitry, the received battery voltage to a battery voltage threshold stored at a memory operatively coupled to the processing circuitry, wherein the battery voltage threshold is based on a shared voltage magnitude, and wherein each of the non-rechargeable batteries in the population having a characteristic for the received battery voltage to converge at the shared voltage magnitude prior to end of service life and each having a same estimated percent depth of discharge (% DoD) at the shared voltage magnitude; in response to determining that the received battery voltage satisfies the battery voltage threshold, calculating, by the processing circuitry, an amount of time remaining before the end of service life of the non-rechargeable battery, wherein the calculation is based on the estimated percent depth of discharge (% DoD) at the shared voltage magnitude and a usage rate of electrical energy output by the battery.

Example 26: The method of example 25, further includes determining, by the processing circuitry, the usage rate based on the % DoD used per unit time, and calculating, by the processing circuitry, the usage rate by dividing the % DoD by a length of time since beginning of life.

Example 27: The method of any of examples 25 and 26, wherein the sensor comprises an electrical voltage sensor, the device further includes determining, by the processing circuitry, the usage rate based on the measured battery electrical current magnitude, and calculating, by the processing circuitry, the amount of time remaining before the end of service life of the non-rechargeable battery based on: the measured battery electrical current magnitude; and the % DoD.

Example 28: The method of any combination of examples 25 through 27, wherein the usage rate is a first usage rate, and wherein calculating the amount of time remaining comprising calculating the amount of time remaining based on an estimation that the first usage rate from beginning of life (BOL) to a percent depth of discharge (DoD), which the sensor indicates that the battery voltage satisfies the battery voltage threshold, will be substantially the same as a second usage rate from when the battery voltage satisfies the battery voltage threshold to the end of service life.

Example 29: The method of any combination of examples 25 through 28, wherein the processing circuitry is configured to output the elective replacement indicator at a predetermined calculated time remaining before the end of service life, wherein the predetermined calculated time remaining is based on: the % DoD; and the second usage rate.

Example 30: The method of any combination of examples 25 through 29, wherein calculating the amount of time remaining before the end of service life of the non-rechargeable battery comprises calculating the amount of time remaining according to: $X*(1-Y)/Y$, wherein: X is the amount of time from beginning of life (BOL) to a time the processing circuitry received the indication from the sensor that the measured battery voltage equals the shared voltage magnitude, and Y is a percent depth of discharge at which the measured battery voltage equals the shared voltage magnitude.

Example 31: The method of any combination of examples 25 through 30, wherein the processing circuitry is configured to output the elective replacement indication at a time in which the processing circuitry received the indication from the sensor that the measured battery voltage satisfies the battery voltage threshold.

Example 32: The method of any combination of examples 25 through 31, wherein the processing circuitry is configured to output the elective replacement indicator at a predetermined calculated time remaining before the end of service life, wherein the predetermined calculated time remaining is based on: the % DoD; and the second usage rate.

Example 33: The method of any combination of examples 25 through 32, wherein the battery voltage threshold is based on a guard band associated with the shared voltage magnitude.

Example 34: The method of any combination of examples 25 through 33, wherein the non-rechargeable battery comprises SVO battery chemistry.

Example 35: The method of any combination of examples 25 through 34, wherein the shared voltage magnitude is approximately the same magnitude for each non-rechargeable battery in the population of non-rechargeable batteries with manufacturing variability.

Example 36: The method of any combination of examples 25 through 35, wherein the processing circuitry is configured to output an indication of end of service life based on a calculated duration after the processing circuitry outputs the indication of the elective replacement indicator.

Example 37: The method of any combination of examples 25 through 36, wherein the processing circuitry is configured to output an indication of end of service life based on the measured battery voltage satisfying an end of service life threshold stored in a look-up table at the memory and after the processing circuitry outputs the indication of the elective replacement indicator.

Example 38: A non-transitory computer-readable storage medium comprising instructions that, when executed, cause one or more processors of a computing device to: calculate an amount of time remaining before the end of service life of a non-rechargeable battery that is one of a population of non-rechargeable batteries, wherein the calculation is based on: receiving an indication from a sensor that a measured battery voltage of the non-rechargeable battery satisfies a battery voltage threshold, and a usage rate of electrical energy output by the battery; wherein the sensor is operatively coupled to the processing circuitry, and the sensor is configured to measure the battery voltage of the non-rechargeable battery, wherein the computer-readable storage medium comprises a memory configured to store the battery voltage threshold, which is based on a shared voltage magnitude, and wherein each of the non-rechargeable batteries in the population having a characteristic to converge at the shared voltage magnitude prior to end of service life and each having a same estimated percent depth of discharge (% DoD) at the shared voltage magnitude.

Example 39: The non-transitory computer-readable storage medium of example 38, further includes determine the usage rate based on a percent DoD used per unit time, and calculate the usage rate by dividing the used percent DoD of the battery by a length of time since beginning of life.

Example 40: The non-transitory computer-readable storage medium of any of examples 38 and 39, wherein the sensor comprises an electrical voltage sensor, the device further includes determine the usage rate based on the measured battery electrical current magnitude, and determine the amount of time remaining before the end of service life of the non-rechargeable battery based on: the measured battery electrical current magnitude; and the % DoD.

Example 41: The non-transitory computer-readable storage medium of any combination of examples 38 through 40, wherein the usage rate is a first usage rate, and wherein to calculate the amount of time remaining, the non-transitory computer-readable storage medium further comprising instructions for causing a programmable processor to calculate the amount of time remaining based on an estimation that the first usage rate from beginning of life (BOL) to a depth of discharge (DoD), which the sensor indicates that the battery voltage satisfies the battery voltage threshold, will be substantially the same as a second usage rate from when the battery voltage satisfies the battery voltage threshold to the end of service life.

Example 42: The non-transitory computer-readable storage medium of any combination of examples 38 through 41, further comprising instructions for causing a programmable processor to output the elective replacement indication at a predetermined calculated time remaining before the end of service life, wherein the predetermined calculated time remaining is based on: the % DoD; and the second usage rate.

Example 43: The non-transitory computer-readable storage medium of any combination of examples 38 through 42, further comprising instructions for causing a programmable processor to calculate the amount of time remaining before the end of service life of the non-rechargeable battery according to: X*(1−Y)/Y, wherein: X is the amount of time from beginning of life (BOL) to a time the processing circuitry received the indication from the sensor that the measured battery voltage equals the shared voltage magnitude, and Y is a percent depth of discharge at which the measured battery voltage equals the shared voltage magnitude.

Example 44: The non-transitory computer-readable storage medium of any combination of examples 38 through 43, further comprising instructions for causing a programmable processor to output the elective replacement indication at a time in which the processing circuitry received the indication from the sensor that the measured battery voltage satisfies the battery voltage threshold.

Example 45: The non-transitory computer-readable storage medium of any combination of examples 38 through 44, wherein the battery voltage threshold is based on a guard band associated with the shared voltage magnitude.

Example 46: The non-transitory computer-readable storage medium of any combination of examples 38 through 45, further comprising instructions for causing a programmable processor wherein the non-rechargeable battery comprises SVO battery chemistry.

Example 47: The non-transitory computer-readable storage medium of any combination of examples 38 through 46, wherein the shared voltage magnitude is approximately the same magnitude for each non-rechargeable battery in the population of non-rechargeable batteries with manufacturing variability.

Example 48: The non-transitory computer-readable storage medium of any combination of examples 38 through 47, wherein the processing circuitry is configured to output an indication of end of service life based on a calculated duration after the processing circuitry outputs the indication of the elective replacement indicator.

Example 49: The non-transitory computer-readable storage medium of any combination of examples 38 through 48, wherein the processing circuitry is configured to output an indication of end of service life based on the measured battery voltage satisfying an end of service life threshold stored in a look-up table at the memory and after the processing circuitry outputs the indication of the elective replacement indicator.

Various examples of the disclosure have been described. These and other examples are within the scope of the following claims.

What is claimed is:

1. An implantable medical device (IMD), the IMD comprising:

processing circuitry operatively coupled to a memory;

a non-rechargeable battery that is one of a population of non-rechargeable batteries, wherein the IMD does not comprise the population of non-rechargeable batteries, and wherein one or more non-rechargeable batteries of the population of batteries have differences in battery capacity; and a sensor, operatively coupled to the processing circuitry, the sensor configured to measure a battery voltage of the non-rechargeable battery, wherein the memory is configured to store a battery voltage threshold derived from a shared voltage magnitude, each of the non-rechargeable batteries in the population having a characteristic to converge at the shared voltage magnitude prior to end of service life and each having a same estimated percent depth of discharge (% DoD) at the shared voltage magnitude; and wherein the processing circuitry is configured to:

calculate an amount of time remaining before the end of service life of the non-rechargeable battery, wherein the calculation is based on:

receiving an indication from the sensor that the measured battery voltage satisfies the battery voltage threshold, and a usage rate of electrical energy output by the non-rechargeable battery; and output an elective replacement indicator (ERI) based on the calculation.

2. The IMD of claim 1, wherein the processing circuitry is configured to determine the usage rate based on the % DoD used per unit time, and wherein the processing circuitry calculates the usage rate by dividing the used % DoD of the non-rechargeable battery by a length of time since beginning of life.

3. The IMD of claim 1:

wherein the sensor comprises an electrical voltage sensor, the device further comprising an electrical current sensor configured to measure battery electrical current magnitude, wherein the processing circuitry is configured to determine the usage rate based on the measured battery electrical current magnitude, and wherein the processing circuitry is configured to determine the amount of time remaining before the end of service life of the non-rechargeable battery based on: the measured battery electrical current magnitude; and the % DoD.

4. The IMD of claim 1, wherein the usage rate is a first usage rate, and wherein to calculate the amount of time remaining, the processing circuitry is configured to calculate the amount of time remaining based on an estimation that the first usage rate from beginning of life (BOL) to a percent depth of discharge (% DoD) at which the sensor indicates that the non-rechargeable battery voltage satisfies the battery voltage threshold, will be substantially the same as a second usage rate from when the battery voltage satisfies the battery voltage threshold to the end of service life.

5. The IMD of claim 4, wherein the processing circuitry is configured to output the elective replacement indication at a predetermined calculated time remaining before the end of service life, wherein the predetermined calculated time remaining is based on:

% DoD; and the second usage rate.

6. The IMD of claim 1, wherein the processing circuitry is configured to calculate the amount of time remaining before the end of service life of the non-rechargeable battery according to: X*(1−Y)/Y, wherein:

X is the amount of time from beginning of life (BOL) to a time the processing circuitry received the indication from the sensor that the measured battery voltage equals the shared voltage magnitude, and Y is a percent depth of discharge at which the measured battery voltage equals the shared voltage magnitude.

7. The IMD of claim 1, wherein the processing circuitry is configured to output the elective replacement indication at a time in which the processing circuitry received the indication from the sensor that the measured battery voltage satisfies the battery voltage threshold.

8. The IMD of claim 1, wherein the battery voltage threshold is derived from a guard band associated with the shared voltage magnitude.

9. The IMD of claim 1, wherein the non-rechargeable battery comprises silver vanadium oxide (SVO) battery chemistry.

10. The IMD of claim 1, wherein the shared voltage magnitude is approximately the same magnitude for each non-rechargeable battery in the population of non-rechargeable batteries, and wherein the one or more non-rechargeable batteries of the population of non-rechargeable batteries having differences in battery capacity is associated with manufacturing variability.

11. The IMD of claim 1, wherein the processing circuitry is configured to output an indication of end of service life based on a calculated duration after the processing circuitry outputs the indication of the elective replacement indicator.

12. The IMD of claim 1, wherein the processing circuitry is configured to output an indication of end of service life based on the measured battery voltage satisfying an end of service life threshold stored in a look-up table at the memory and after the processing circuitry outputs the indication of the elective replacement indicator.

13. The IMD of claim 1, wherein the IMD comprises a pudendal neuromodulation device.

14. The IMD of claim 1, wherein the shared voltage magnitude is less than a voltage magnitude associated with a beginning of life of the non-rechargeable battery and greater than a voltage magnitude associated with end of service life.

15. A system comprising:

at least one electrode configured to deliver electrical stimulation to a patient; and a device comprising:

a non-rechargeable battery that is one of a population of non-rechargeable batteries, wherein the device does not comprise the population of non-rechargeable batteries, and wherein one or more non-rechargeable batteries of the population of non-rechargeable batteries have differences in battery capacity;

a sensor configured to measure a battery voltage of the non-rechargeable battery;

a memory configured to store a battery voltage threshold derived from a shared voltage magnitude, each of the non-rechargeable batteries in the population having a characteristic to converge at the shared voltage magnitude prior to end of service life and each having a same estimated percent depth of discharge (% DoD) at the shared voltage magnitude;

processing circuitry coupled to the memory, the processing circuitry configured to:

deliver one or more electrical stimulation signals to the patient;

calculate an amount of time remaining before the end of service life of the non-rechargeable battery, wherein the calculation is based on receiving an indication from the sensor that the measured battery voltage satisfies the battery voltage threshold, and a usage rate; and output an elective replacement indicator (ERI) based on the calculation.

16. The system of claim 15, wherein the processing circuitry is configured to determine the usage rate based on a % DoD used per unit time, and wherein the processing circuitry calculates the usage rate by dividing the % DoD of the non-rechargeable battery by a length of time since beginning of life.

17. The system of claim 15, wherein the sensor comprises an electrical voltage sensor, the device further comprising an electrical current sensor configured to measure battery electrical current magnitude, and wherein the processing circuitry is configured to determine the usage rate based on the measured battery electrical current magnitude, and wherein the processing circuitry is configured to determine the amount of time remaining before the end of service life of the non-rechargeable battery based on:

the measured battery electrical current magnitude; and the % DoD.

18. The system of claim 15, wherein the usage rate is a first usage rate, wherein to calculate the amount of time remaining, the processing circuitry is configured to calculate the amount of time remaining based on an estimation that the first usage rate from beginning of life (BOL) to a percent depth of discharge (% DoD), which the sensor indicates that the battery voltage satisfies the battery voltage threshold, will be substantially the same as a second usage rate from when the battery voltage satisfies the battery voltage threshold to the end of service life.

19. The system of claim 18, wherein the processing circuitry is configured to output the elective replacement indication at a predetermined calculated time remaining before the end of service life, wherein the predetermined calculated time remaining is based on:

the % DoD; and the second usage rate.

20. The system of claim 15, wherein the processing circuitry is configured to output an indication of end of service life based on a calculated duration after the processing circuitry outputs the indication of the elective replacement indicator.

21. The system of claim 15, wherein the processing circuitry is configured to output an indication of end of service life based on the measured battery voltage satisfying an end of service life threshold stored in a look-up table at the memory and after the processing circuitry outputs the indication of the elective replacement indicator.

22. A method for operating a battery powered medical device, the method comprising:

receiving, from a sensor operatively coupled to a non-rechargeable battery of the battery powered medical device, a battery voltage of the non-rechargeable battery, wherein the non-rechargeable battery is one of a population of non-rechargeable batteries, wherein the battery powered medical device does not comprise the population of non-rechargeable, and wherein one or more non-rechargeable batteries of the population of non-rechargeable batteries have differences battery capacity;

comparing, by processing circuitry, the received battery voltage to a battery voltage threshold stored at a memory operatively coupled to the processing circuitry, wherein the battery voltage threshold is derived from a shared voltage magnitude, each of the non-rechargeable batteries in the population having a characteristic for the received battery voltage to converge at the shared voltage magnitude prior to end of service life and each having a same estimated percent depth of discharge (% DoD) at the shared voltage magnitude;

in response to determining that the received battery voltage satisfies the battery voltage threshold, calculating, by the processing circuitry, an amount of time remaining before the end of service life of the non-rechargeable battery, wherein the calculation is based on the estimated percent depth of discharge (% DoD) at the shared voltage magnitude and a usage rate of electrical energy output by the non-rechargeable battery; and outputting, by the processing circuitry, an elective replacement indicator (ERI) based on the calculation.

23. An implantable medical device (IMD), the IMD comprising:

processing circuitry operatively coupled to a memory;

a non-rechargeable battery that is one of a population of non-rechargeable batteries, wherein the IMD does not comprise the population of non-rechargeable batteries, and wherein one or more non-rechargeable batteries of the population of non-rechargeable batteries have differences in battery capacity; and a sensor, operatively coupled to the processing circuitry, the sensor configured to measure a battery voltage of the non-rechargeable battery, wherein the memory is configured to store a battery voltage threshold based on a shared voltage magnitude, each of the non-rechargeable batteries in the population having a characteristic to converge at the shared voltage magnitude prior to end of service life and each having a same estimated percent depth of discharge (% DoD) at the shared voltage magnitude, and wherein the shared voltage magnitude is less than a voltage magnitude associated with a beginning of life of the non-rechargeable battery and greater than a voltage magnitude associated with end of service life; and wherein the processing circuitry is configured to:

calculate an amount of time remaining before the end of service life of the non-rechargeable battery, wherein the calculation is based on:

receiving an indication from the sensor that the measured battery voltage satisfies the battery voltage threshold, and a usage rate of electrical energy output by the non-rechargeable battery; and output an elective replacement indicator (ERI) based on the calculation.

* * * * *